(12) United States Patent
Park et al.

(10) Patent No.: US 8,058,168 B2
(45) Date of Patent: Nov. 15, 2011

(54) METHOD OF FABRICATING SEMICONDUCTOR DEVICE HAVING METAL-SEMICONDUCTOR COMPOUND REGIONS

(75) Inventors: Jong-Chul Park, Suwon-si (KR); Yun-Seung Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/656,885

(22) Filed: Feb. 18, 2010

(65) Prior Publication Data

US 2010/0216289 A1  Aug. 26, 2010

(30) Foreign Application Priority Data

Feb. 20, 2009  (KR) ........................ 10-2009-0014433

(51) Int. Cl.
*H01L 21/44* (2006.01)
(52) U.S. Cl. ...................................... 438/669
(58) Field of Classification Search ........................ None
See application file for complete search history.

(56) References Cited

U.S. PATENT DOCUMENTS

| 7,348,628 | B2 | 3/2008 | Yoon et al. | |
|---|---|---|---|---|
| 2006/0097304 | A1 | 5/2006 | Yoon et al. | |
| 2007/0246783 | A1* | 10/2007 | Moon et al. | 257/384 |
| 2007/0269979 | A1* | 11/2007 | Cho | 438/669 |
| 2007/0295995 | A1 | 12/2007 | Yun et al. | |
| 2008/0157194 | A1* | 7/2008 | Lee et al. | 257/334 |
| 2008/0191288 | A1* | 8/2008 | Kwon et al. | 257/383 |

FOREIGN PATENT DOCUMENTS

| JP | 2007-329480 | 12/2007 |
|---|---|---|
| KR | 10-0618875 | 9/2006 |
| KR | 10-0734266 | 7/2007 |
| KR | 10-0739532 | 9/2007 |

\* cited by examiner

*Primary Examiner* — Charles Garber
*Assistant Examiner* — Andre' C Stevenson
(74) *Attorney, Agent, or Firm* — Harness, Dickey & Pierce, P.L.C.

(57) ABSTRACT

Example embodiments relate to methods of fabricating a semiconductor device having a metal-semiconductor compound region. A method according to example embodiments may include forming semiconductor pillars on a semiconductor substrate. The semiconductor substrate between the semiconductor pillars may be etched to form a trench region. A dielectric isolation pattern partially filling the trench region may be formed, and dielectric sidewall spacers may be formed on sidewalls of the semiconductor pillars. Metal-semiconductor compound regions may be formed on sidewalls of a portion of the trench region that is not filled by the isolation pattern.

20 Claims, 18 Drawing Sheets

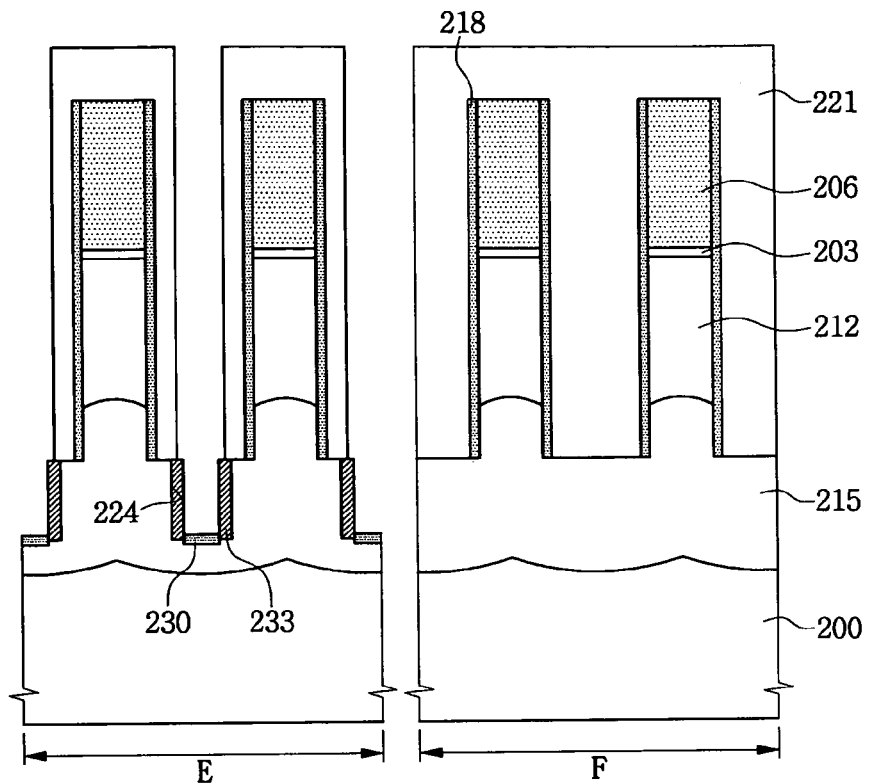
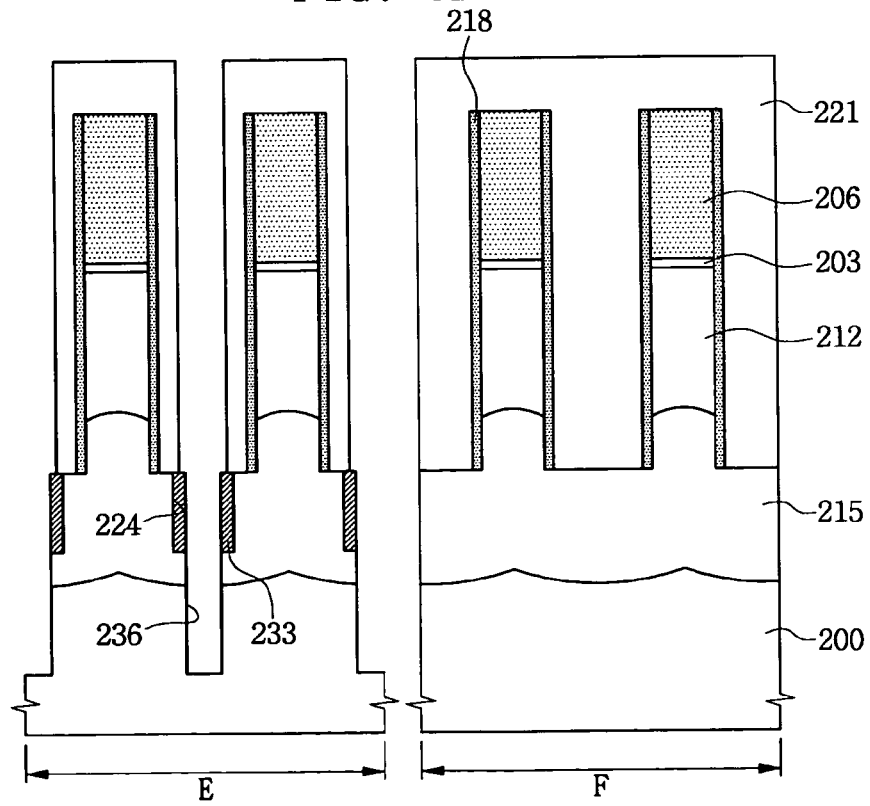

METHOD OF FABRICATING SEMICONDUCTOR DEVICE HAVING METAL-SEMICONDUCTOR COMPOUND REGIONS

CROSS-REFERENCE TO RELATED APPLICATION

This application claims the benefit of priority under 35 U.S.C. §119 from Korean Patent Application No. 10-2009-0014433, filed on Feb. 20, 2009, the contents of which are hereby incorporated herein by reference in its entirety.

BACKGROUND

1. Field

Example embodiments relate to methods of fabricating a semiconductor device, including methods of fabricating a semiconductor device having metal-semiconductor compound regions.

2. Description of Related Art

Demand has been increasing for semiconductor devices having a smaller size and lower power consumption. As a result, efforts have been made to reduce the size of constituent elements of a semiconductor device.

SUMMARY

Example embodiments relate to methods of fabricating a semiconductor device, wherein the device is capable of reducing or minimizing a two-dimensional area occupied by metal-semiconductor compound regions electrically connected with source/drain regions of vertical transistors. A method of fabricating a semiconductor device having a metal-semiconductor compound region according to example embodiments may include forming semiconductor pillars on a semiconductor substrate. The semiconductor substrate between the semiconductor pillars may be etched to form a trench region. A dielectric isolation pattern may be formed to partially fill the trench region, and dielectric sidewall spacers may be formed on sidewalls of the semiconductor pillars. Metal-semiconductor compound regions may be formed on sidewalls of a portion of the trench region that is not filled by the isolation pattern.

The semiconductor pillars may be two-dimensionally arranged in row and column directions when viewed from the top, and the trench region may have the shape of a line parallel to the row or column direction. The method may further include forming an insulating pattern on the isolation pattern. The insulating pattern may fill the remaining portions of the trench region and cover the metal-semiconductor compound regions. The method may further include etching the sidewall spacers to expose the sidewalls of the semiconductor pillars and forming gate patterns surrounding the exposed sidewalls of the semiconductor pillars after forming the insulating pattern. The gate patterns may include directional linear gate lines intersecting the trench region.

The method may further include forming gate patterns surrounding the sidewalls of the semiconductor pillars prior to forming the trench region and forming gate structures electrically connecting the gate patterns after forming the insulating pattern. The method may further include implanting and activating impurities into the semiconductor substrate between the semiconductor pillars to form impurity regions having a conductive type different from that of the semiconductor pillars prior to forming the trench region. The trench region may have a bottom region located at a level lower than the impurity regions. After forming the trench region, the impurity regions may remain in the semiconductor substrate so as to be adjacent to the sidewalls of the trench region, thereby forming ohmic contacts with the metal-semiconductor compound regions. Forming the isolation pattern and sidewall spacers may include forming a spacer insulating layer filling the trench region while covering the sidewalls of the semiconductor pillars such that an opening is formed between the semiconductor pillars and etching the spacer insulating layer such that the isolation pattern and sidewall spacers are formed.

A method of fabricating a semiconductor device having a metal-semiconductor compound region formed on sidewalls of first and second trench regions may include forming semiconductor pillars on a semiconductor substrate. The semiconductor substrate between the semiconductor pillars may be etched to form a first trench region. Metal-semiconductor compound regions may be formed on sidewalls of the first trench region. The semiconductor substrate of a bottom region of the first trench region may be etched to form a second trench region.

The method may further include forming a dielectric isolation pattern so as to fill the first and second trench regions while covering the metal-semiconductor compound regions. The method may further include forming gate patterns surrounding sidewalls of the semiconductor pillars after forming the isolation pattern. The method may further include forming gate patterns surrounding sidewall of the semiconductor pillars prior to forming the first trench region and forming gate structures electrically connecting the gate patterns after forming the isolation pattern.

The semiconductor pillars may be two-dimensionally arranged in row and column directions when viewed from the top, and the first and second trench regions may have the shape of a line parallel to the row or column direction. The method may further include implanting and activating impurities into the semiconductor substrate between the semiconductor pillars to form impurity regions having a conductive type different from that of the semiconductor pillars prior to forming the first trench region. The impurity regions may be located at a level higher than a bottom region of the second trench region and may form ohmic contacts with the metal-semiconductor compound regions.

Forming the first trench region may include forming a dielectric material layer on the semiconductor substrate having the first trench region, patterning the dielectric material layer to form an opening between the semiconductor pillars, and etching the semiconductor substrate exposed by the opening. The opening may be spaced apart from the semiconductor pillars and may expose a predetermined region of the semiconductor substrate between the semiconductor pillars.

Forming the metal-semiconductor compound regions may include forming a sacrificial spacer on sidewalls of the first trench region and the opening, performing thermal oxidation on the semiconductor substrate having the sacrificial spacer to form a thermal oxide layer on the bottom region of the first trench region, removing the sacrificial spacer to expose the sidewalls of the first trench region, and performing a silicide process to form the metal-semiconductor compound regions on the exposed sidewalls of the first trench region.

Forming the second trench region may include etching the thermal oxide layer formed on the bottom region of the first trench region as well as the semiconductor substrate under the thermal oxide layer. The dielectric material layer may be removed after forming the second trench region.

BRIEF DESCRIPTION OF THE DRAWINGS

Example embodiments are described in further detail below with reference to the accompanying drawings. It should be understood that various aspects of the drawings may have been exaggerated for clarity.

FIGS. 10A through 10F are cross-sectional views of a method of manufacturing the semiconductor device of FIG. 9.

DETAILED DESCRIPTION

Figure 1:
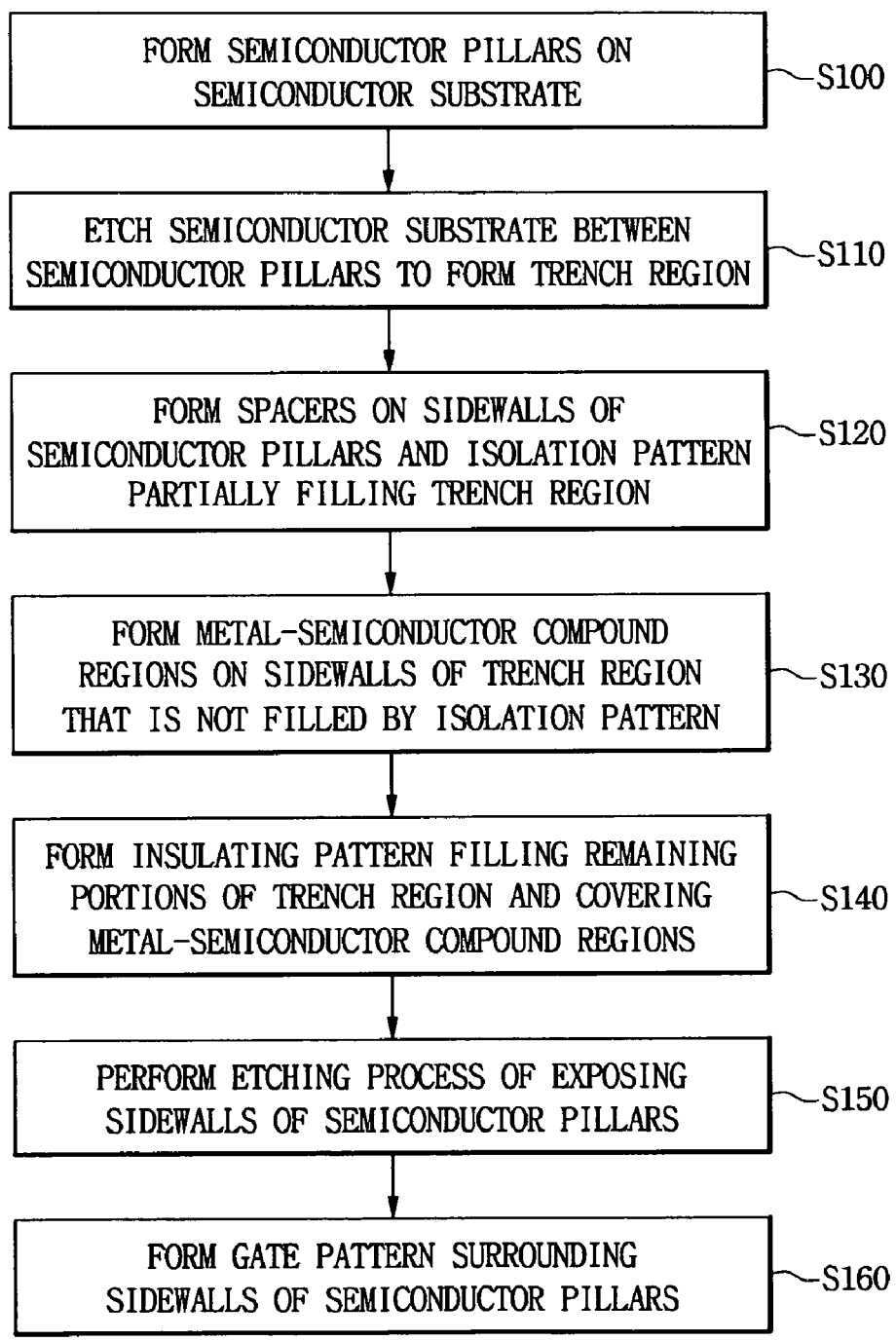
FIG. 1 is a process flowchart illustrating a method of fabricating a semiconductor device according to a non-limiting example embodiment.

Various devices and methods of fabricating the same will now be described more fully with reference to the accompanying drawings in which some example embodiments are shown. In the drawings, the thicknesses of layers and regions may have been exaggerated for clarity.

Detailed illustrative embodiments are disclosed herein. However, it should be understood that the specific structural and functional details disclosed herein are merely representative for purposes of describing example embodiments. The inventive concepts herein may be embodied in many alternate forms and should not be construed as limited to the examples discussed.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Spatially relative terms, such as "beneath," "below," "lower," "above," "upper," and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, it should be understood that the present inventive concepts are not limited to example embodiments described herein.

Figure 2:
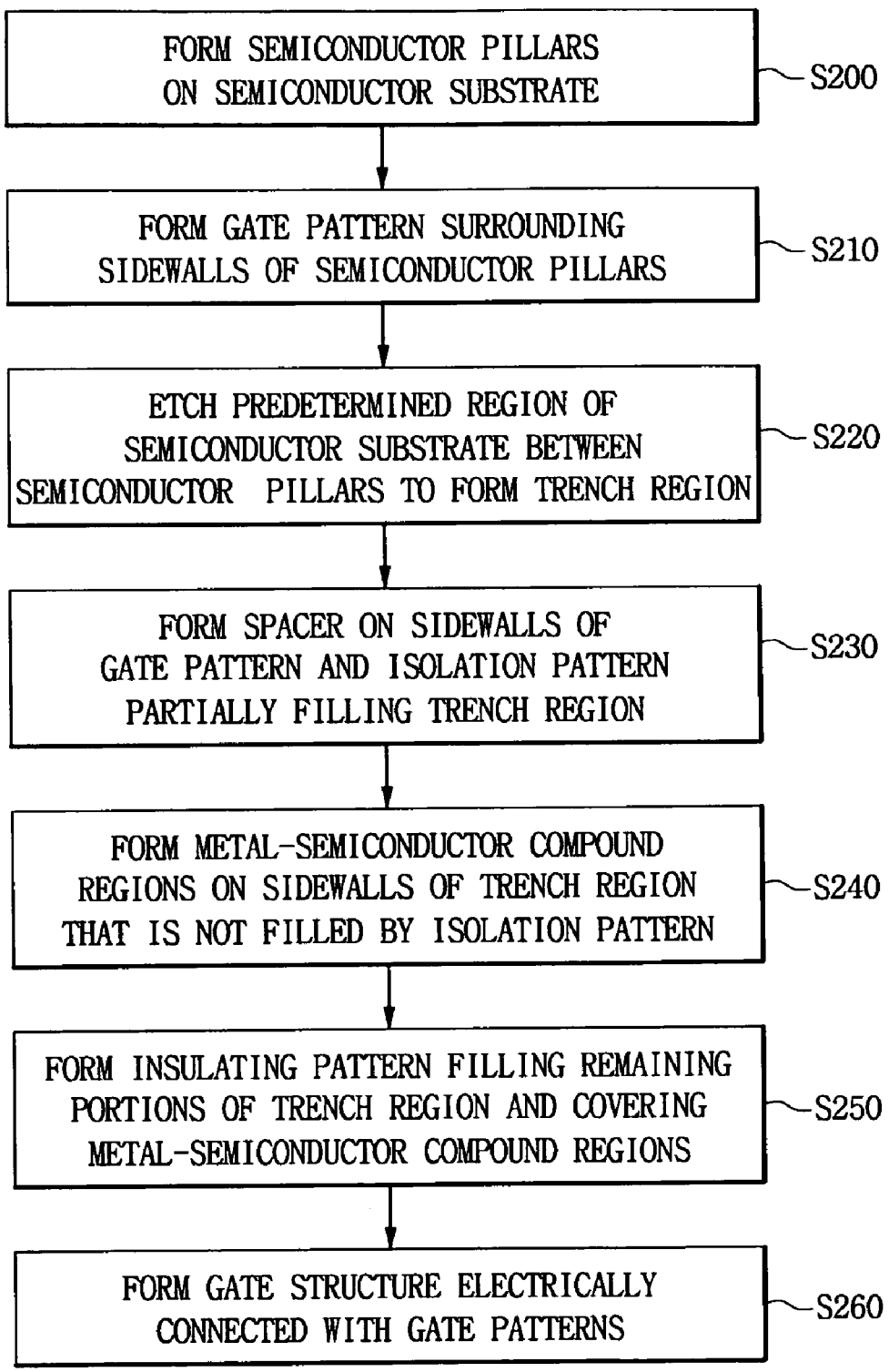
FIG. 2 is a process flowchart illustrating a method of fabricating a semiconductor device according to another non-limiting example embodiment.
Figure 3:
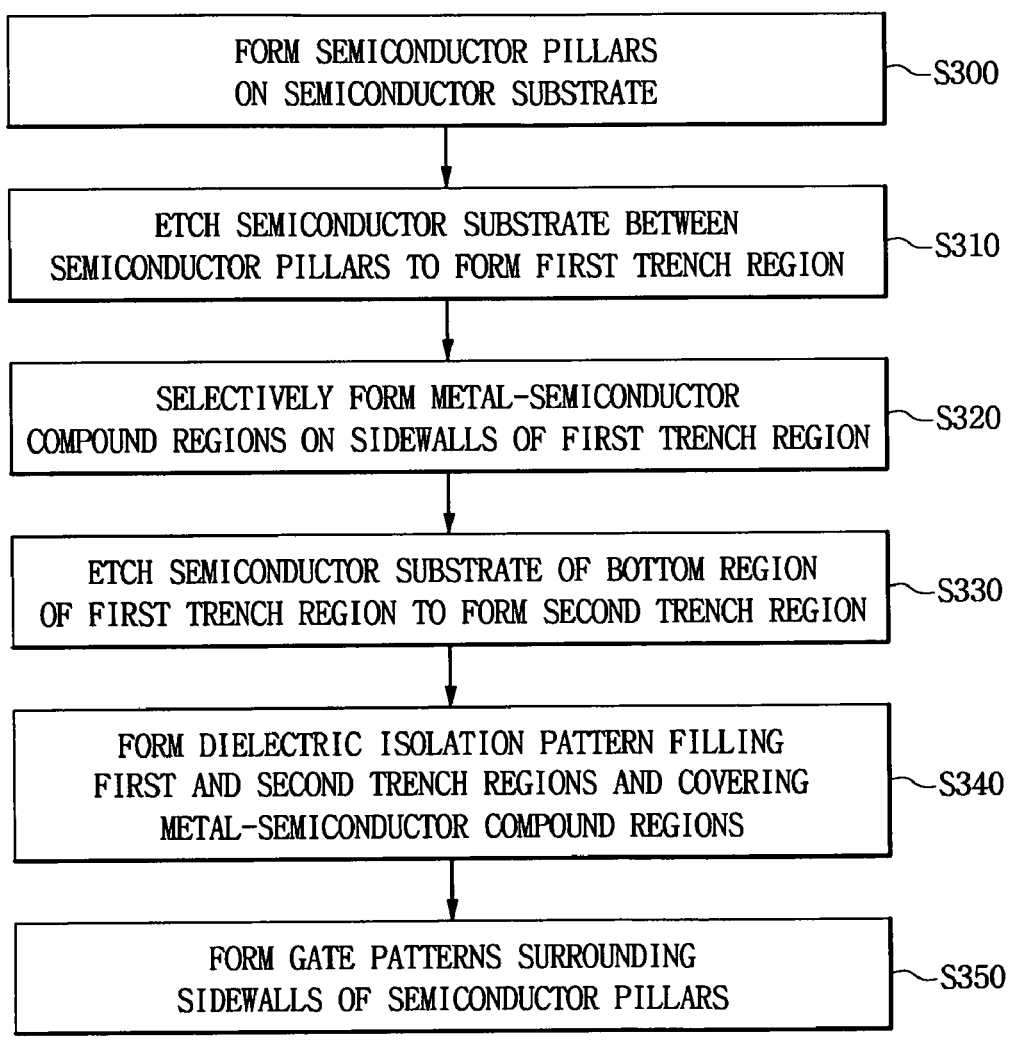
FIG. 3 is a process flowchart illustrating a method of fabricating a semiconductor device according to still another non-limiting example embodiment.
Figure 4:
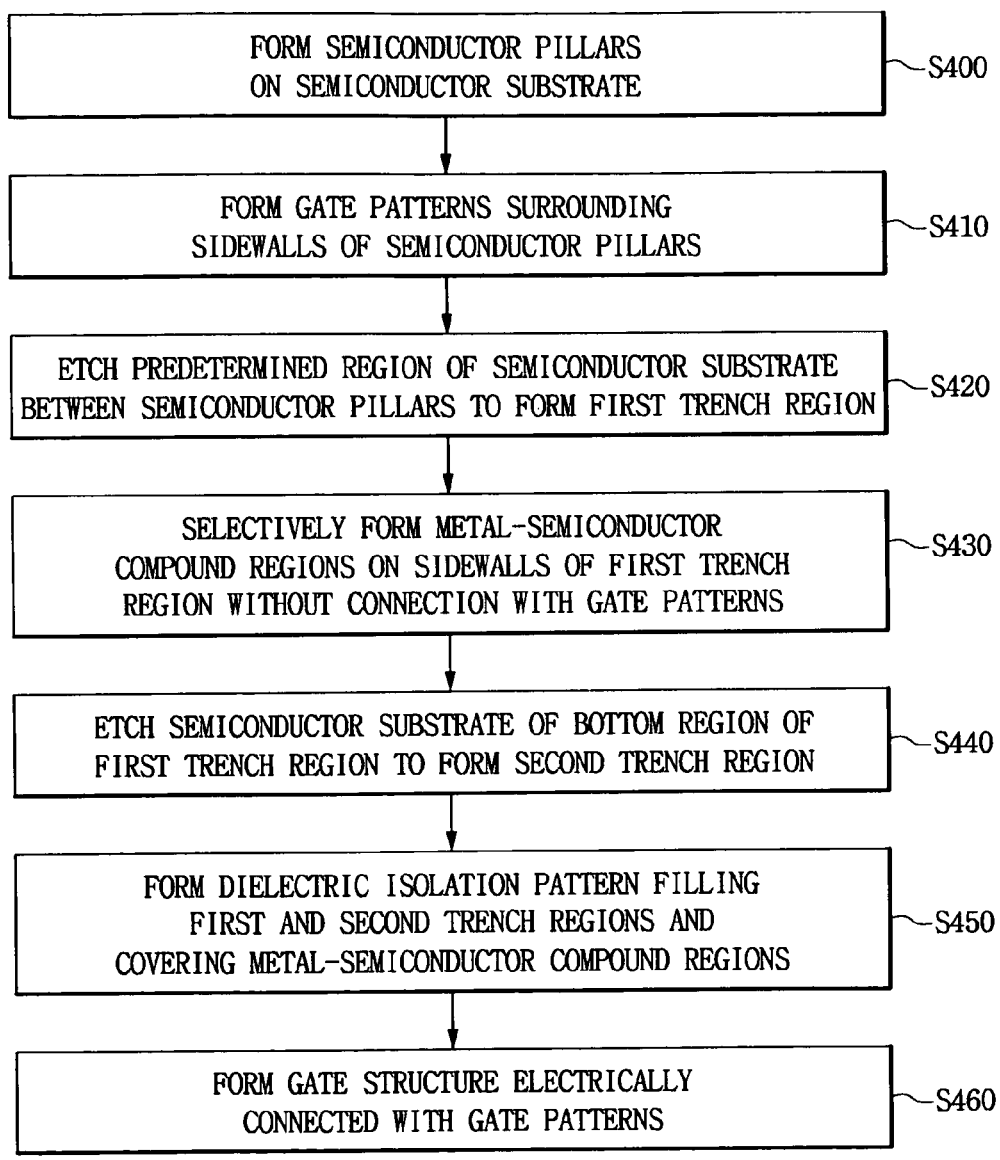
FIG. 4 is a process flowchart illustrating a method of fabricating a semiconductor device according to yet another non-limiting example embodiment.

FIG. 1 is a process flowchart illustrating a method of fabricating a semiconductor device according to a non-limiting example embodiment. FIG. 2 is a process flowchart illustrating a method of fabricating a semiconductor device according to another non-limiting example embodiment. FIG. 3 is a process flowchart illustrating a method of fabricating a semiconductor device according to still another non-limiting example embodiment. FIG. 4 is a process flowchart illustrating a method of fabricating a semiconductor device according to yet another non-limiting example embodiment.

First, a method of fabricating a semiconductor device according to a non-limiting example embodiment will be described with reference to FIG. 1. Referring to FIG. 1, semiconductor pillars may be formed on a semiconductor substrate (S100). The semiconductor pillars may be formed of semiconductor material (e.g., silicon). The semiconductor substrate between the semiconductor pillars may be etched to form a trench region (S110).

Spacers may be formed on sidewalls of the semiconductor pillars, and an isolation pattern that partially fills the trench region may be formed (S120). For instance, a spacer dielectric layer may be formed on the semiconductor substrate having the trench region, and etched to form the spacers and the isolation pattern. The spacers and the isolation pattern may be formed of a dielectric material (e.g., silicon oxide). Metal-semiconductor compound regions may be selectively formed on sidewalls of a portion of the trench region not filled by the isolation pattern (S130). Each metal-semiconductor compound region may have a metal silicide layer (e.g., a nickel silicide layer, a cobalt silicide layer, a titanium silicide layer, or the like).

A dielectric pattern may be formed to fill the remaining portions of the trench region and cover the metal-semiconductor compound regions (S140). The dielectric pattern may be formed of a dielectric material (e.g., silicon oxide).

An etching process of exposing the sidewalls of the semiconductor pillars may be performed (S150). For example, the etching process may include etching the spacers to expose the sidewalls of the semiconductor pillars. Gate patterns surrounding the sidewalls of the semiconductor pillars may be formed (S160). Forming the gate patterns may include sequentially forming a gate dielectric layer, which surrounds the sidewalls of the semiconductor pillars, and a gate electrode.

Each metal-semiconductor compound region may be electrically connected with one of source/drain regions of a vertical transistor. The source/drain regions may be formed using various suitable methods. For example, forming one of the source/drain regions may include etching the semiconductor substrate to form semiconductor pillars using photolithography and etching processes, and implanting and activating impurities between the semiconductor pillars to form a first impurity region having a conductive type different from that of the semiconductor pillars. Alternatively, forming one of the source/drain regions may include etching the semiconductor substrate to form preliminary semiconductor pillars using photolithography and etching processes, implanting and activating impurities between the preliminary semiconductor pillars to form a first impurity region, and etching the semiconductor substrate between the preliminary semiconductor pillars to form semiconductor pillars. Furthermore, before the first impurity region is formed by an ion implantation process, an ion implantation mask spacer serving as an ion implantation mask may be formed on sidewalls of the semiconductor pillars.

Forming the other of the source/drain regions may include implanting impurities into upper regions of the semiconductor pillars to form a second impurity region after the gate pattern is formed. Alternatively, forming the other of the source/drain regions may include implanting impurities into the semiconductor substrate prior to carrying out the photolithography and etching processes for forming the semiconductor pillars.

Next, a method of fabricating a semiconductor device according to another non-limiting example embodiment will be described with reference to FIG. 2. Referring to FIG. 2, semiconductor pillars may be formed on a semiconductor substrate (S200). Gate patterns surrounding sidewalls of the semiconductor pillars may be formed (S210). Forming the gate patterns may include sequentially forming a gate dielectric layer, which surrounds the sidewalls of the semiconductor pillars, and a gate electrode.

Impurities may be implanted and activated into the semiconductor substrate between the semiconductor pillars, thereby forming a first impurity region. The first impurity region may be defined as one of the source/drain regions of a vertical transistor. A predetermined region of the semiconductor substrate between the semiconductor pillars surrounded by the gate patterns may be etched to form a trench region (S220). After the trench region is formed, the first impurity regions may remain on the semiconductor substrate adjacent to sidewalls of the trench region.

A spacer may be formed on sidewalls of the gate patterns, and an isolation pattern may be formed to partially fill the trench region (S230). For example, a spacer insulating layer may be formed on the semiconductor substrate having the trench region, and then etched to form the spacer and the isolation pattern. The spacer and the isolation pattern may be formed of a dielectric material (e.g., silicon oxide).

Metal-semiconductor compound regions may be formed on the sidewalls of the portion of the trench region not filled by the isolation pattern (S240). The metal-semiconductor compound regions may be formed of metal silicide. The metal-semiconductor compound regions may be electrically connected with the first impurity region. The metal-semiconductor compound regions and the first impurity region may form ohmic contacts.

An insulating pattern may be formed to fill the remaining portions of the trench region and cover the metal-semiconductor compound regions (S250). The insulating pattern may be formed of dielectric material (e.g., silicon oxide). A gate structure may be formed to be electrically connected with the gate patterns (S260).

Forming the other of the source/drain regions of the vertical transistor may include implanting impurities into upper regions of the semiconductor pillars to form a second impurity region after forming the gate structure. Alternatively, forming the other of the source/drain regions may include implanting impurities into the semiconductor substrate prior to carrying out the photolithography and etching processes for forming the semiconductor pillars.

Next, a method of fabricating a semiconductor device according to still another non-limiting example embodiment will be described with reference to FIG. 3. Referring to FIG. 3, semiconductor pillars may be formed on a semiconductor substrate (S300): First impurity regions may be formed on the semiconductor substrate between the semiconductor pillars. The semiconductor substrate between the semiconductor pillars may be etched to form a first trench region (S310). For example, forming the first trench region may include forming a mask pattern, which has an opening exposing a predetermined region of the semiconductor substrate between the semiconductor pillars, on the semiconductor substrate having the first impurity region, and etching the exposed semiconductor substrate using the mask pattern as an etch mask. The mask pattern may cover sidewalls of the semiconductor pillars.

Metal-semiconductor compound regions may be formed on sidewalls of the first trench region (S320). For example, forming the metal-semiconductor compound regions may include forming a sacrificial spacer on the sidewalls of the first trench region, forming a thermal oxide layer on the bottom region of the first trench region, removing the sacrificial spacer, and forming a metal silicide layer on the sidewalls of the first trench region.

The semiconductor substrate of the bottom region of the first trench region may be etched to form a second trench region (S330). A dielectric isolation pattern may be formed to fill the first and second trench regions and cover the metal-semiconductor compound regions (S340). During forming the isolation pattern, sidewalls of the semiconductor pillars may be at least partially exposed. A gate pattern may be formed to surround the exposed sidewalls of the semiconductor pillars (S350). The gate pattern may include a sequentially formed gate dielectric layer and a gate electrode.

After the gate pattern is formed, impurities may be implanted into upper regions of the semiconductor pillars, thereby forming a second impurity region. Alternatively, prior to carrying out photolithography and etching processes for forming the semiconductor pillars, impurities may be implanted into the semiconductor substrate, thereby forming a second impurity region.

Next, a method of fabricating a semiconductor device according to yet another non-limiting example embodiment will be described with reference to FIG. 4. Referring to FIG. 4, semiconductor pillars may be formed on a semiconductor substrate (S400). Gate patterns surrounding sidewalls of the semiconductor pillars may be formed (S410). The gate patterns may include a sequentially formed gate dielectric layer and a gate electrode. First impurity regions may be formed on the semiconductor substrate between the semiconductor pillars. The semiconductor substrate between the semiconductor pillars may be etched to form a first trench region (S420). For example, forming the first trench region may include forming a mask pattern, which has an opening exposing a predetermined region of the semiconductor substrate between the semiconductor pillars, on the semiconductor substrate having the first impurity regions, and etching the exposed semiconductor substrate using the mask pattern as an etch mask. The mask pattern may cover sidewalls of the gate patterns.

Metal-semiconductor compound regions may be selectively formed on sidewalls of the first trench region, and separated from the gate pattern (S430). For example, forming the metal-semiconductor compound regions may include forming a sacrificial spacer on the sidewalls of the first trench region, forming a thermal oxide layer on a bottom region of the first trench region, removing the sacrificial spacers, and forming a metal silicide layer on the sidewalls of the first trench region.

The semiconductor substrate of the bottom region of the first trench region may be etched to form a second trench region (S440). A dielectric isolation pattern may be formed to fill the first and second trench regions and cover the metal-semiconductor compound regions (S450). A gate structure may be formed to be electrically connected with the gate patterns.

After the gate structure is formed, impurities may be implanted into upper regions of the semiconductor pillars, thereby forming a second impurity region. Alternatively, prior to carrying out photolithography and etching processes for forming the semiconductor pillars, impurities may be implanted into the semiconductor substrate, thereby forming a second impurity region.

Various illustrative examples have been disclosed below in a more concrete fashion so that those ordinarily skilled in the art can more readily adapt and apply the inventive concepts to actual devices. The non-limiting examples of FIGS. 1 through 3 are further illustrated by FIGS. 5 through 10F. However, the non-limiting example of FIG. 4 has not been further illustrated, because those ordinarily skilled in the art will be able to readily adapt and apply the inventive concept of FIG. 4 based on the non-limiting examples taught by FIGS. 2 and 3.

Figure 5:
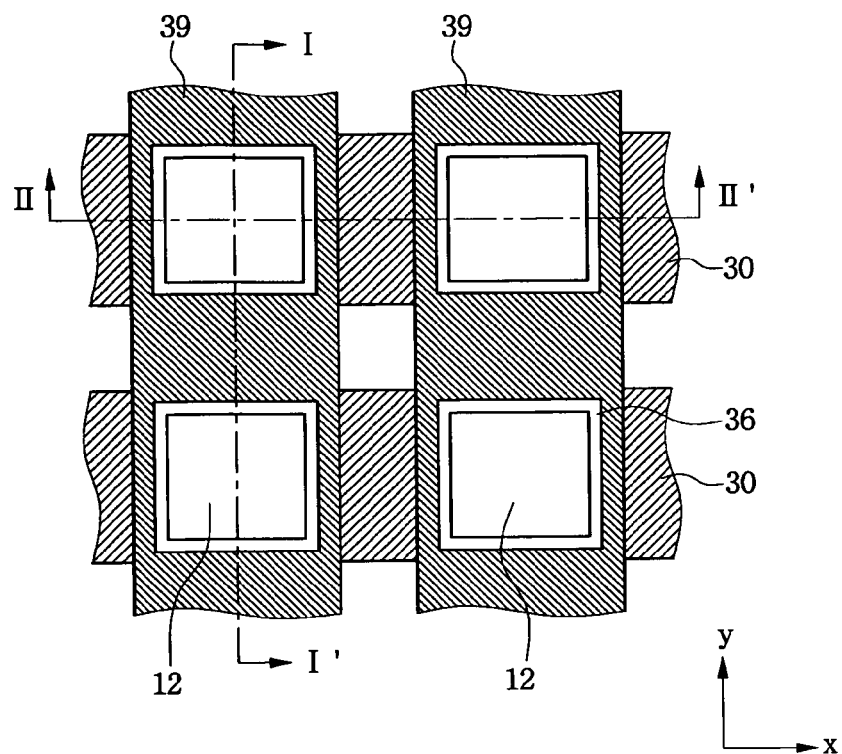
FIG. 5 is a plan view of a semiconductor device according to a non-limiting example embodiment.
Figure 6A:
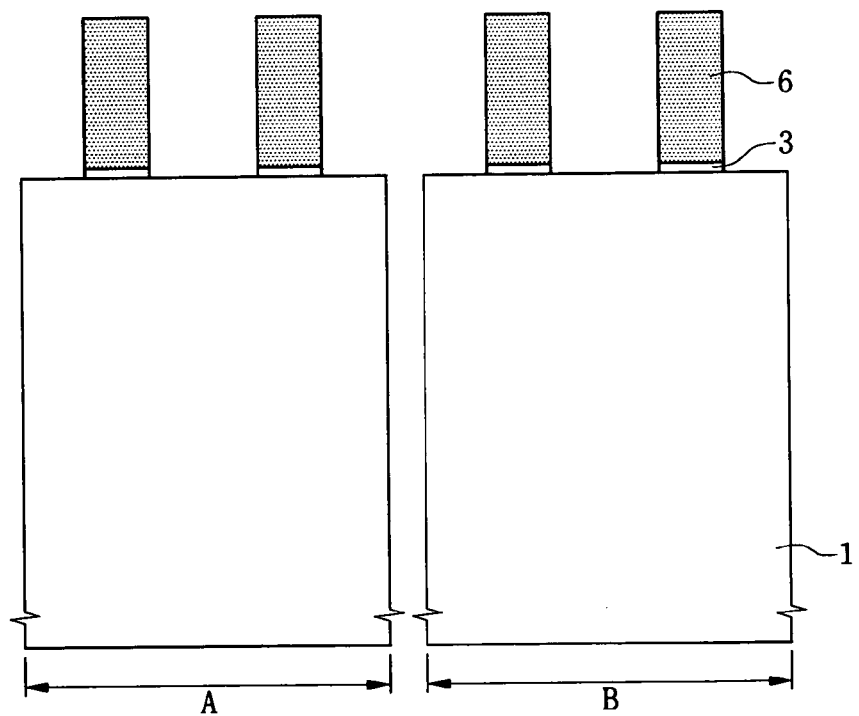
FIGS. 6A through 6J are cross-sectional views of a method of fabricating the semiconductor device of FIG. 5.
Figure 7:
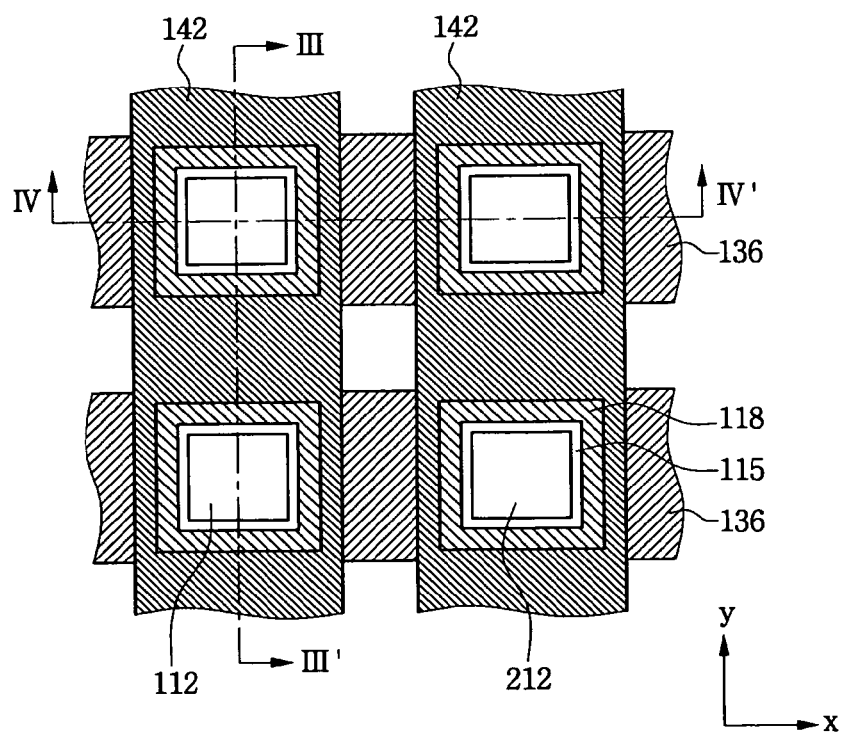
FIG. 7 is a plan view of a semiconductor device according to another non-limiting example embodiment.
Figure 8A:
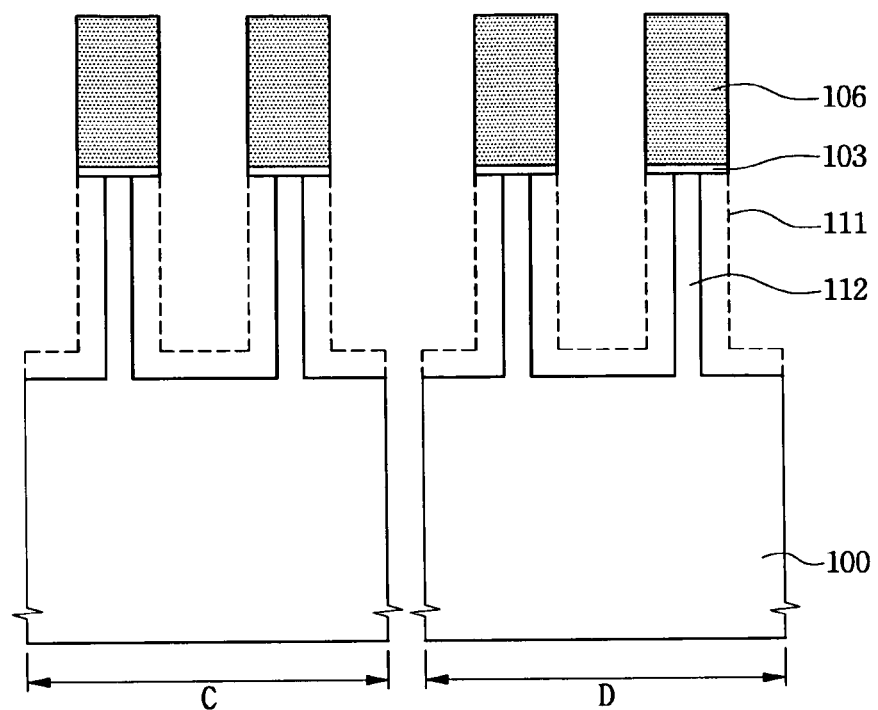
FIGS. 8A through 8I are cross-sectional views of a method of fabricating the semiconductor device of FIG. 7.

FIG. 5 is a plan view of a semiconductor device according to a non-limiting example embodiment. FIGS. 6A through 6J are cross-sectional views of a method of fabricating the semiconductor device of FIG. 5. In FIGS. 6A through 6J, a part indicated by "A" is a region taken along line I-I' of FIG. 5, and a part indicated by "B" is a region taken along line II-II' of FIG. 5. FIG. 7 is a plan view of a semiconductor device according to another non-limiting example embodiment. FIGS. 8A through 8I are cross-sectional views of a method of fabricating the semiconductor device of FIG. 7. In FIGS. 8A through 8I, a part indicated by "C" is a region taken along line III-III' of FIG. 7, and a part indicated by "D" is a region taken along line IV-IV' of FIG. 7. FIG. 9 is a plan view of a semiconductor device according to still another non-limiting example embodiment. FIGS. 10A through 10F are cross-sectional views of a method of fabricating the semiconductor device of FIG. 9. In FIGS. 10A through 10F, a part indicated by "E" is a region taken along line V-V' of FIG. 9, and a part indicated by "F" is a region taken along line VI-VI' of FIG. 9.

A non-limiting method of fabricating a semiconductor device will be described with reference to FIGS. 1, 5, and 6A-6J. Referring to FIGS. 1, 5, and 6A, a semiconductor substrate 1 may be prepared. The semiconductor substrate 1 may include a semiconductor wafer formed of a semiconductor material (e.g., silicon). Pad oxide layers 3 and mask patterns 6 may be sequentially stacked on the semiconductor substrate 1. The pad oxide layers 3 may be formed of a thermal oxide layer. The mask patterns 6 may be formed of a silicon nitride layer.

Figure 6B:
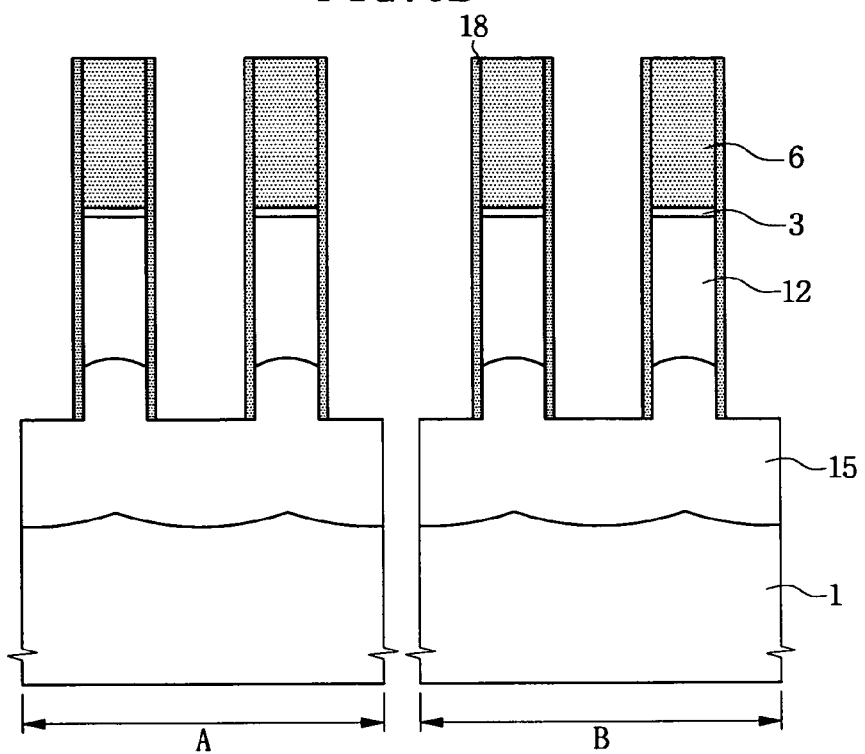

Referring to FIGS. 1, 5, and 6B, the semiconductor substrate 1 may be etched using the mask patterns 6 as an etch mask, thereby forming semiconductor pillars 12 (S100). When viewed from the top, the semiconductor pillars 12 may be two-dimensionally arranged in row and column directions. Here, the term "row" or "column" is used to indicate two different directions on the substrate, and thus does not refer to an absolute vertical or horizontal direction. For example, the "row" may be parallel to an "x" axis, and the "column" may be parallel to a "y" axis. A sidewall spacer 18 may be formed on sidewalls of the semiconductor pillars 12. The sidewall spacer 18 may include at least one of a silicon nitride layer and a silicon oxide layer.

Impurities may be implanted and activated into the semiconductor substrate 1 between the semiconductor pillars 12, thereby forming first impurity regions 15. The first impurity regions 15 may be defined as the source/drain regions of a transistor. The first impurity regions 15 may have a conductive type different from that of the semiconductor pillars 12. For example, the semiconductor pillars 12 may be of a p-type, and the first impurity regions 15 may be of an n-type.

Forming the first impurity regions 15 may include etching the semiconductor substrate 1 to form preliminary semiconductor pillars using the mask patterns 6 as the etch mask, forming a sidewall spacer 18 on sidewalls of the preliminary semiconductor pillars, implanting impurities into the semiconductor substrate 1 between the preliminary semiconductor pillars to form first impurity regions 15, and etching the semiconductor substrate 1 between the preliminary semiconductor pillars. The sidewall spacer 18 may serve to prevent the impurities from being implanted into channel regions of the semiconductor pillars 12 during the ion implantation process of forming the first impurity regions 15.

In the drawings, the size or volume of each component may not have been shown to scale, as such is not necessary to facilitate the understanding of the inventive concepts. Thus, the illustration of the components are not intended to limit their absolute or relative size. Rather, the size or volume of each component may be further optimized through various tests. Junctions of the first impurity regions 15 may be somewhat changed in the shape shown in FIG. 6B depending on conditions and/or procedures of the process of forming the first impurity regions 15, or a device to be finally formed. For example, when a vertical transistor to be formed is used for a capacitor-less one transistor memory cell, the first impurity regions 15 may be formed to be diffused into the semiconductor substrate 1 under the semiconductor pillars 12. Thus, the first impurity regions 15 may be formed between the semiconductor pillars 12 and the semiconductor substrate 1. Alternatively, when the capacitor electrically connected with one of the source/drain regions of the transistor is used for a memory cell, it is not necessary for the first impurity regions 15 to be diffused under the semiconductor pillars 12.

Figure 6C:
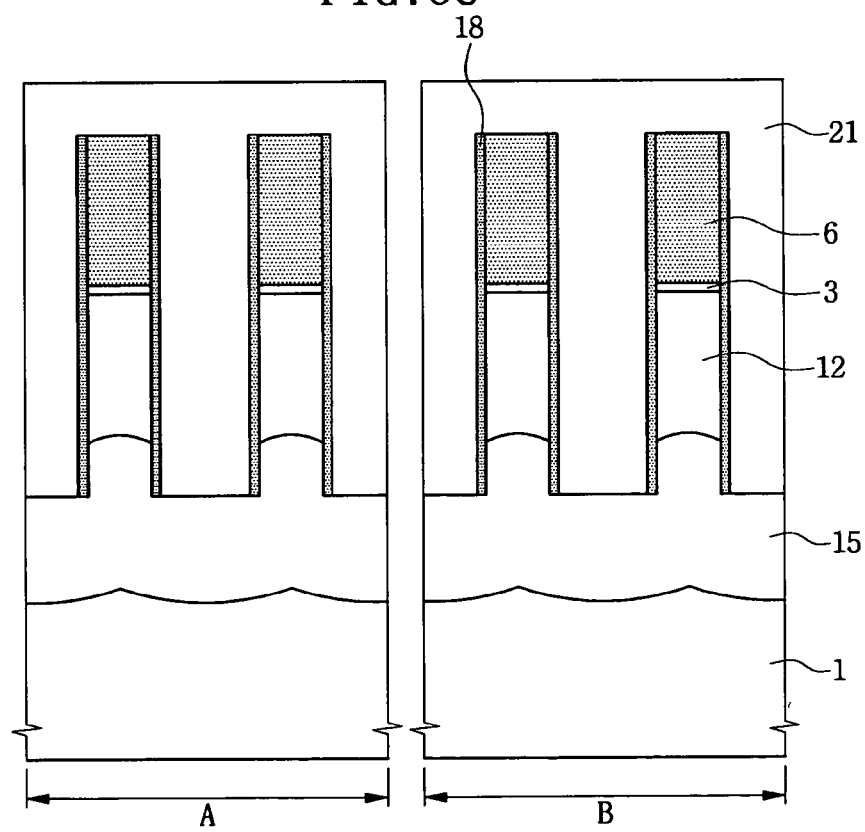

Referring to FIGS. 1, 5, and 6C, a dielectric material layer 21 may be formed on the entire surface of the semiconductor substrate having the first impurity regions 15. The dielectric material layer 21 may be filled between the semiconductor pillars 12. The dielectric material layer may be formed of silicon oxide.

Figure 6D:
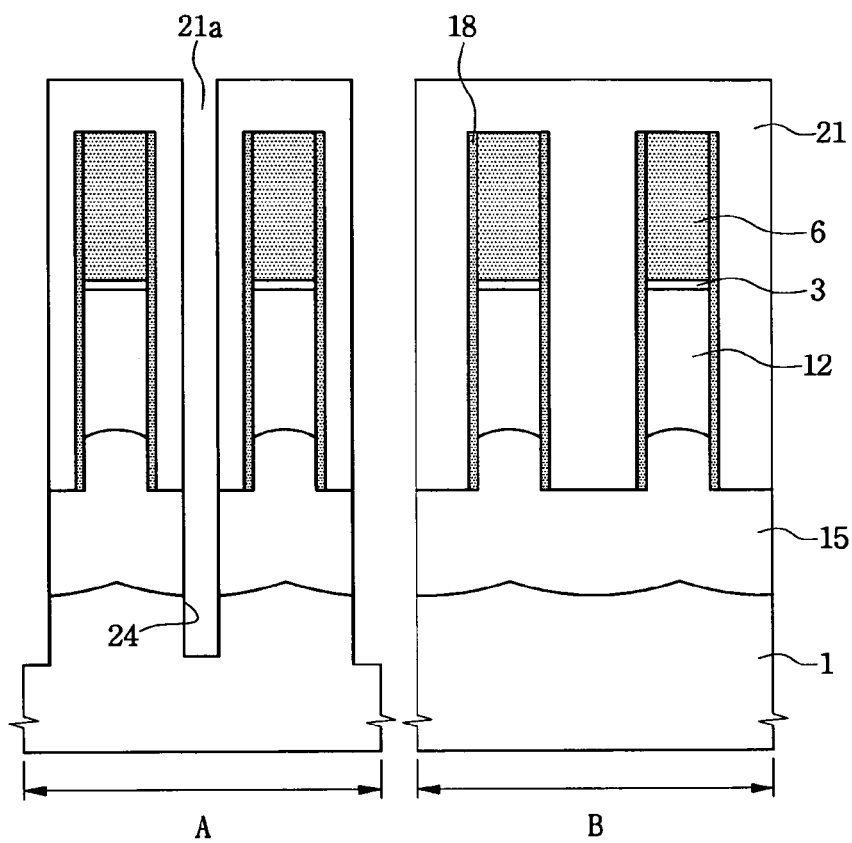

Referring to FIGS. 1, 5, and 6D, the dielectric material layer 21 may be patterned to form openings 21a, each of which exposes a predetermined region of the semiconductor substrate 1 between the semiconductor pillars 12. The semiconductor substrate 1 exposed by the openings 21a may be etched to form trench regions 24 (S110). Each trench region 24 may have the shape of a line extending parallel to the row or column direction when viewed from the top.

Figure 6E:
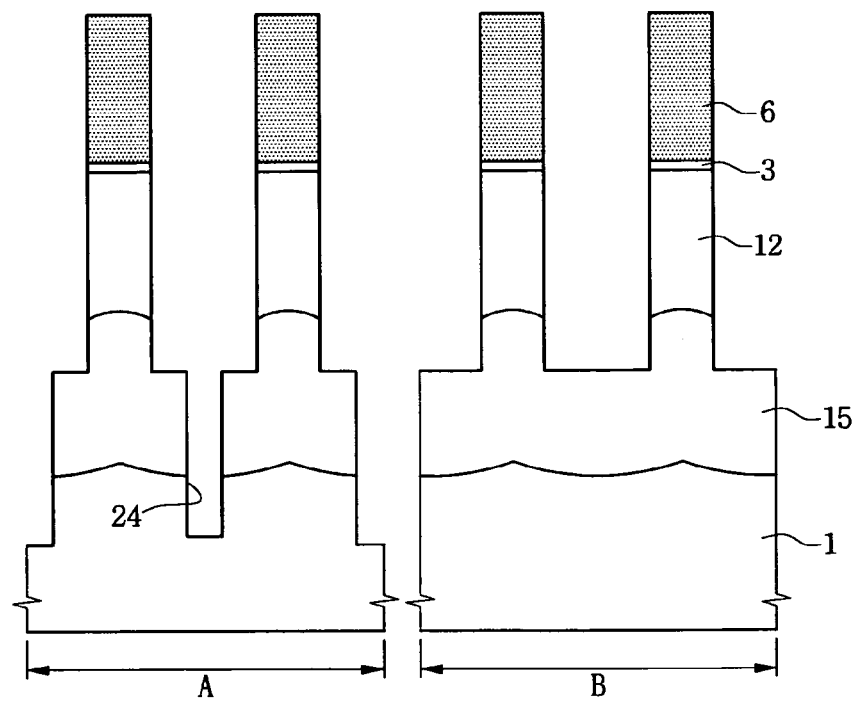

Referring to FIG. 6E, the dielectric material layer 21 (of FIG. 6D) and the sidewall spacers 18 (of FIG. 6D) may be removed. Alternatively, the process of removing the sidewall spacers 18 (of FIG. 6D) may be omitted, so that the sidewall spacers 18 (of FIG. 6D) may remain.

Figure 6F:
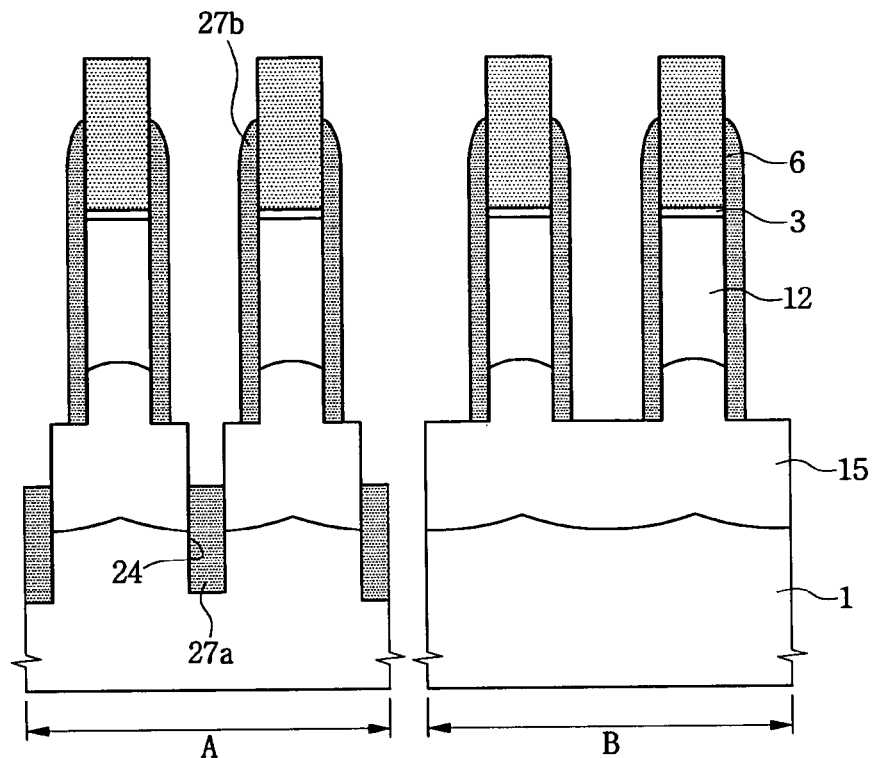

Referring to FIGS. 1, 5, and 6F, a spacer insulating layer may be formed on the semiconductor substrate 1 and etched to form dielectric spacers 27b on the sidewalls of the semiconductor pillars 12 as well as dielectric isolation patterns 27a partially filling the trench regions 24 (S120). Both the dielectric spacers 27b and the dielectric isolation patterns 27a may be formed of silicon oxide. The spacer insulating layer may be formed to a thickness sufficient to cover the sidewalls of the semiconductor pillars 12, form an empty space between the semiconductor pillars 12, and fill the trench regions 24. For example, the spacer insulating layer may be formed to a thickness greater than half a width of the trench region 24 while being able to form an opening between the semiconductor pillars 12. As a result, the trench regions 24 may be partially filled by the isolation patterns 27a, and the sidewalls of the semiconductor pillars 12 may be covered by the dielectric spacers 27b and/or the sidewall spacers 18 (of FIG. 6D).

Figure 6G:
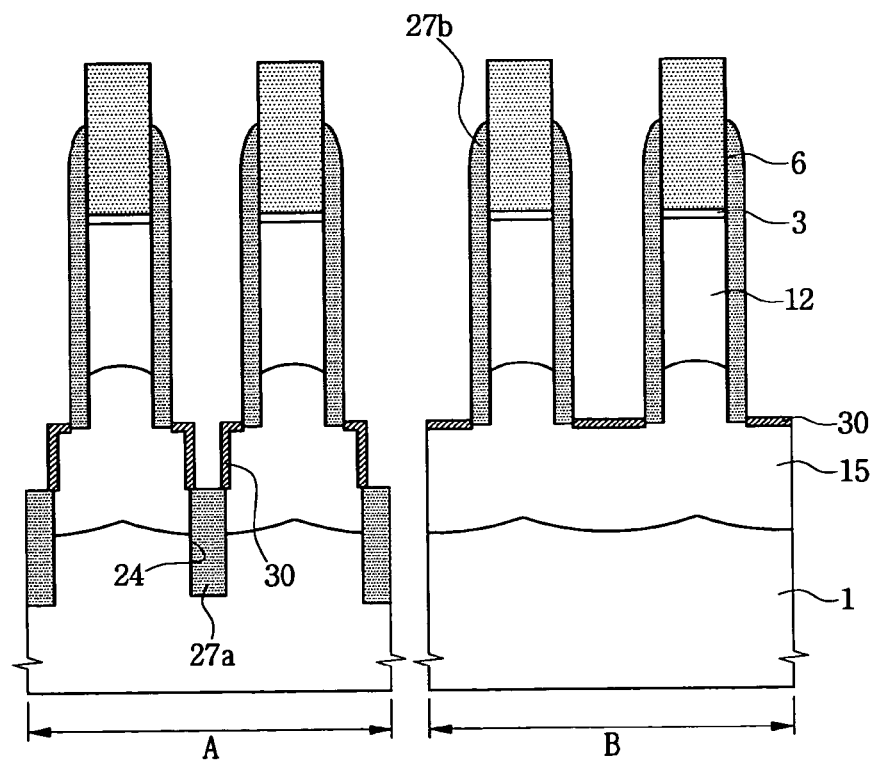

Referring to FIGS. 1, 5, and 6G, metal-semiconductor compound regions 30 may be formed on the sidewalls of portions of the trench regions 24 that are not filled by the dielectric isolation patterns 27a using a silicide process (S130). For example, a metal layer and a capping layer may be sequentially formed on the semiconductor substrate having the dielectric isolation patterns 27a, and the metal layer may be reacted with the semiconductor substrate of the sidewalls of portions of the trench regions 24 that are not filled by the dielectric isolation patterns 27a using a silicide heat treatment process, thereby forming the metal-semiconductor compound regions 30, and removing the unreacted metal layer and/or the unreacted capping layer. Each metal-semiconductor compound region 30 may include a silicide material layer formed of cobalt silicide, titanium silicide, or nickel silicide. The capping layer may be formed of metal nitride (e.g., titanium nitride). The metal-semiconductor compound regions 30 may form ohmic contacts with the first impurity regions 15.

Figure 6H:
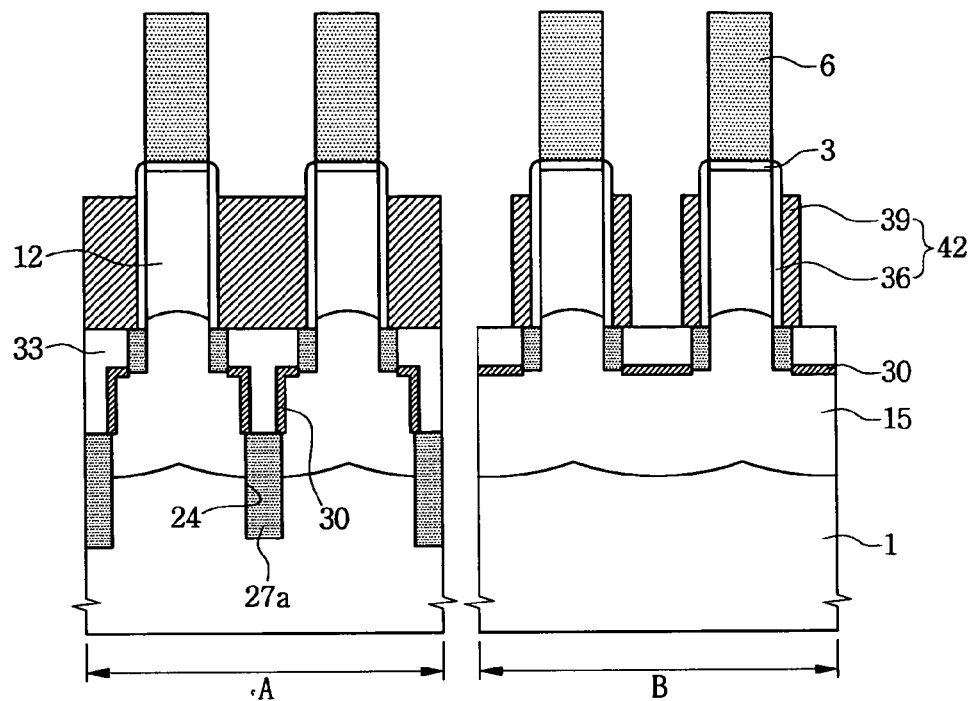

Referring to FIGS. 1, 5, and 6H, an insulating layer may be formed on the semiconductor substrate having the metal-semiconductor compound regions 30, and etched to form an insulating pattern 33, which fills the remaining portions of the trench regions 24 and covers the metal-semiconductor compound regions 30 (S140). The insulating pattern 33 may be formed of silicon oxide. When forming the insulating pattern 33, the dielectric spacers 27b covering the sidewalls of the semiconductor pillars 12 may be etched to at least partially expose the sidewalls of the semiconductor pillars 12 (S150). Similarly, in situations where the sidewall spacers 18 (of FIG. 6D) are still present, the sidewall spacers 18 (of FIG. 6D) may be etched to at least partially expose the sidewalls of the semiconductor pillars 12.

Gate dielectric layers 36 covering the exposed sidewalls of the semiconductor pillars 12 may be formed. The gate dielectric layers 36 may include a silicon oxide layer and/or a high-k dielectric layer. The high-k dielectric layer may include a dielectric having a dielectric constant greater than the silicon oxide layer. A conductive layer may be formed on the semiconductor substrate having the gate dielectric layers 36, and patterned to form directional linear gate lines 39, which surround the semiconductor pillars 12 and intersect the trench regions 24 (S160). For example, a planarized conductive layer may be formed on the semiconductor substrate having the gate dielectric layers 36, and patterned through photolithography and etching processes. The conductive layer may be formed and patterned to form the gate lines 39 before or after the mask patterns 6 are removed.

When viewed from the top, the gate lines 39 may be formed in the shape of a directional line crossing the trench regions 24. For example, if the trench regions 24 are formed in the shape of a line parallel to the row direction, then the gate lines 39 may be formed in the shape of a line parallel to the column direction. The gate lines 39 may be each defined as a gate electrode within the regions surrounding the respective semiconductor pillars 12. The gate dielectric layers 36 and the gate lines 39 may be defined as gate patterns 42.

Figure 6I:
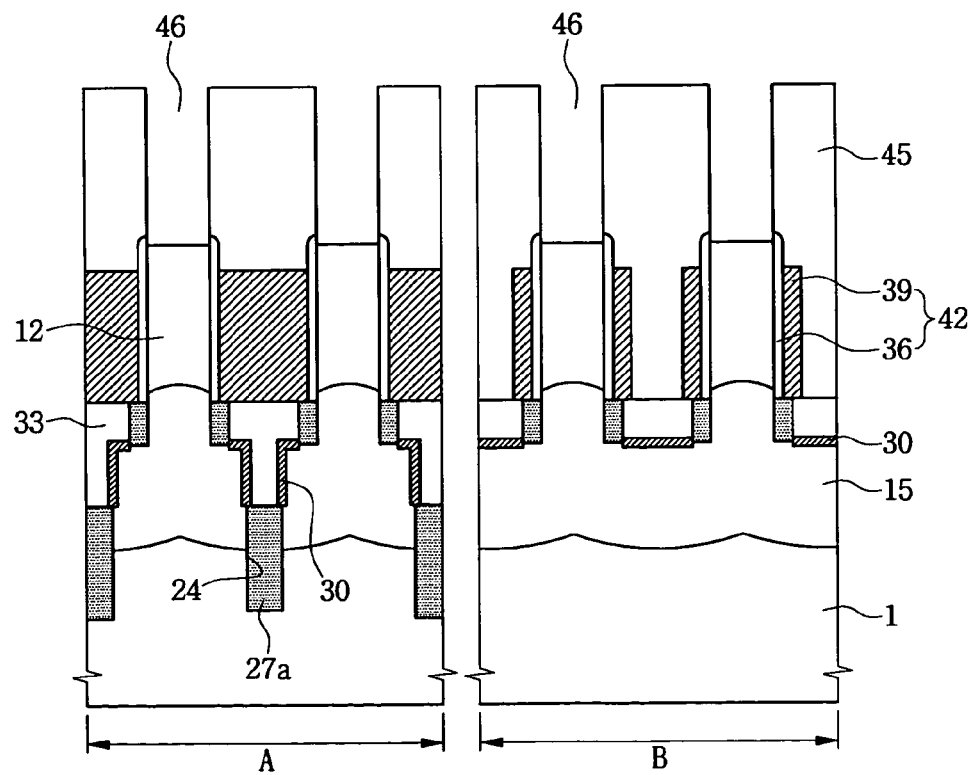

Referring to FIGS. 1, 5, and 6I, an interlayer insulating layer 45 may be formed on the semiconductor substrate 1 having the gate lines 39. The interlayer insulating layer 45 may be formed of material having an etch selectivity with respect to the mask patterns 6 (of FIG. 6H). For example, when the mask patterns 6 (of FIG. 6H) are formed of a silicon nitride layer, the interlayer insulating layer 45 may be formed of a silicon oxide layer. Forming the interlayer insulating layer 45 may include forming a dielectric material layer on the semiconductor substrate 1 having the gate lines 39, and planarizing the dielectric material layer. The planarization may be performed until the top surfaces of mask patterns 6 (of FIG. 6H) are exposed. The mask patterns 6 (of FIG. 6H) and the pad oxide layers 3 (of FIG. 6H) may be removed to form contact holes 46.

Figure 6J:
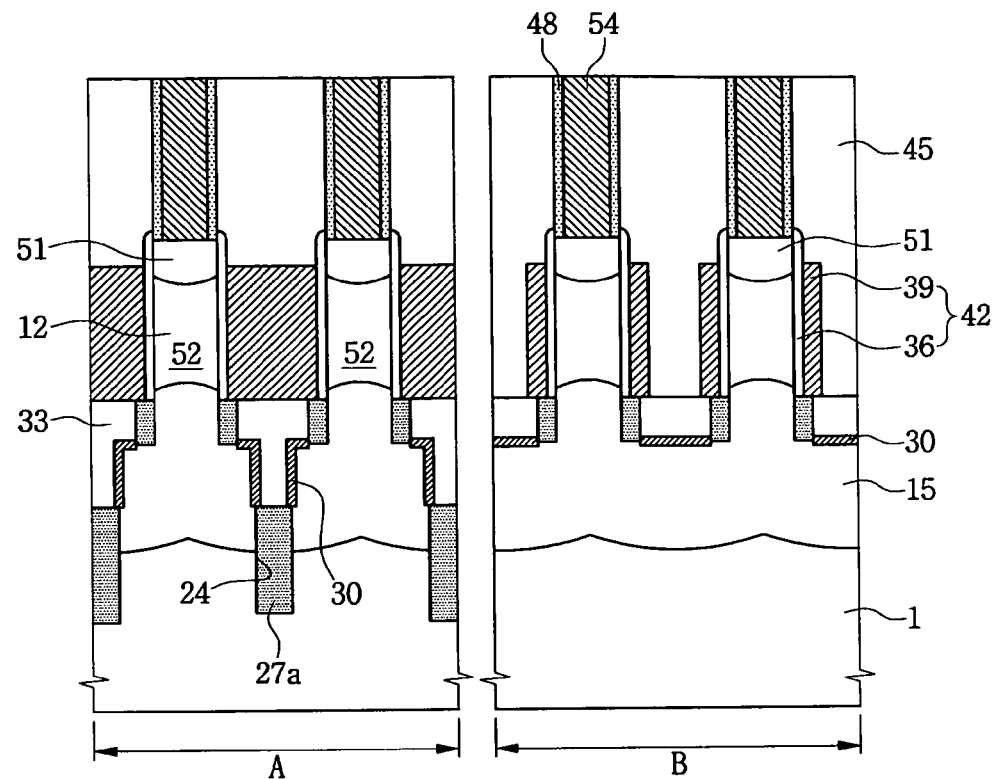

Referring to FIGS. 1, 5, and 6J, contact spacers 48 may be formed on sidewalls of the contact holes 46. The contact spacers 48 may be formed of a dielectric material. For example, the contact spacers 48 may be formed of a silicon oxide layer and/or a silicon nitride layer. Impurities may be implanted into the semiconductor pillars 12 exposed by the contact holes 46, thereby forming second impurity regions 51. The second impurity regions 51 may have the same conductive type as the first impurity regions 15. The first and second impurity regions 15 and 51 may be defined as source/drain regions of transistors. In a non-limiting embodiment, the pad oxide layer 3 (of FIG. 6H) may be removed after the second impurity regions 51 are formed to prevent the surfaces of the semiconductor pillars 12 from being damaged while forming the second impurity regions 51. Conductive contact structures 54 filling the contact holes 46 and electrically connected with the second impurity regions 51 may be formed. Thus, it is possible to form vertical MOS transistors including the first and second impurity regions 15 and 51, the channel regions 52 of the semiconductor pillars 12 defined between the first and second impurity regions 15 and 51, and the gate structures 42 surrounding the channel regions 52.

Next, a method of fabricating a semiconductor device according to another non-limiting example embodiment will be described with reference to FIGS. 2, 7, and 8A through 8I. Referring to FIGS. 2, 7, and 8A (as in FIG. 6A), pad oxide layers 103 and mask patterns 106 may be sequentially stacked on a semiconductor substrate 100. The semiconductor substrate 100 may be etched using the mask patterns 106 as an etch mask, thereby forming semiconductor pillars 112 (S200). In each semiconductor pillar 112, a portion to be defined as a channel region of a transistor may have a width smaller than each mask pattern 106. For example, forming the semiconductor pillars 112 may include etching the semiconductor substrate 100 to form preliminary semiconductor pillars 111 using the mask patterns 106 as an etch mask, performing isotropic etching on the preliminary semiconductor pillars 111, and reducing widths of the preliminary semiconductor pillars 111. Alternatively, forming the semiconductor pillars 112 may include partially etching the semiconductor substrate using the mask patterns 106 as an etch mask, forming protective spacers (not shown) on sidewalls of the partially etched regions, etching the semiconductor substrate 100 to form the preliminary semiconductor pillars 111, and reducing the widths of the preliminary semiconductor pillars 111 using the mask patterns 106 and the protective spacers (not shown) as etch masks. Thus, the region of each semiconductor pillar 112 corresponding to at least a channel region may have a width smaller than each mask pattern 106.

When viewed from the top, the semiconductor pillars 112 may be arranged in row and column directions. Here, the term "row" or "column" is used to indicate two different directions on the substrate, and thus does not refer to an absolute vertical or horizontal direction. For example, the "row" may be parallel to an "x" axis, and the "column" may be parallel to a "y" axis.

Figure 8B:
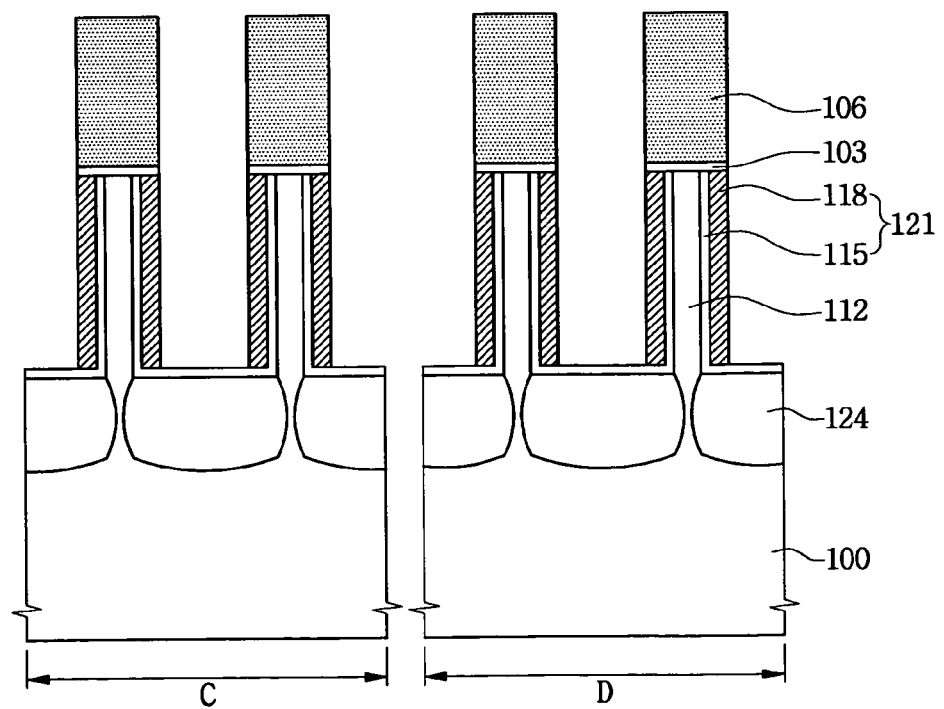
Figure 9:
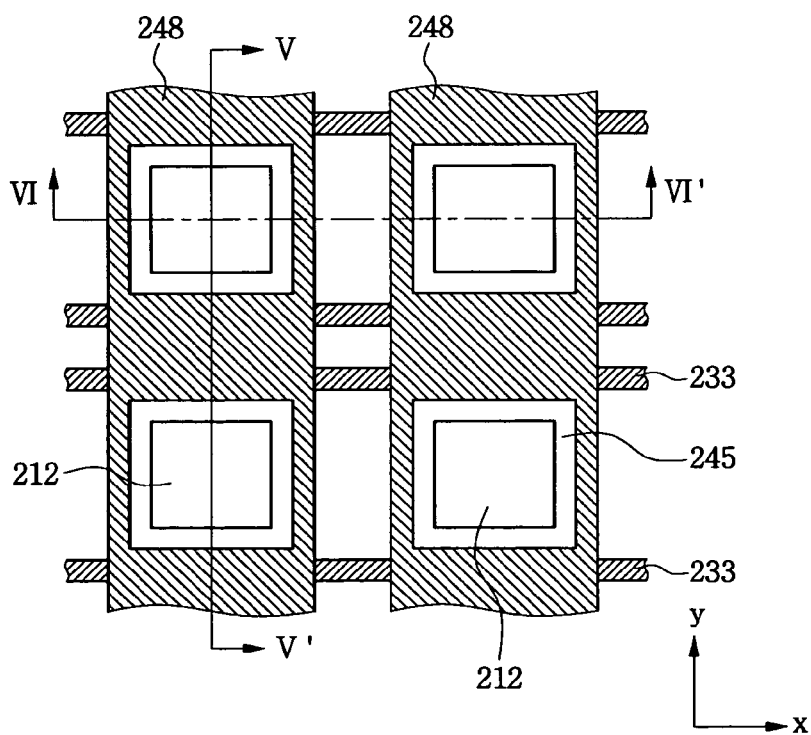
FIG. 9 is a plan view of a semiconductor device according to still another non-limiting example embodiment.

Referring to FIGS. 2, 7 and 8B, gate dielectric layers 115 may be formed on the semiconductor substrate 100 having the semiconductor pillars 112. The gate dielectric layers 115 may surround the semiconductor pillars 112 and cover the semiconductor substrate 100 between the semiconductor pillars 112. The gate dielectric layers 115 may be formed of a silicon oxide layer and/or a high-k dielectric layer. A gate conductive layer may be formed on the semiconductor substrate 100 having the gate dielectric layers 115. The gate conductive layer may be etched using the mask patterns 106 as an etch mask, thereby forming gate electrodes 118 surrounding the semiconductor pillars 112. The gate dielectric layers 115 and the gate electrodes 118 may be defined as gate patterns 121 (S210).

Impurities may be implanted and activated into the semiconductor substrate 100 using the mask patterns 106 and the gate patterns 121 as ion implantation masks. As a result, first impurity regions 124 may be formed in the semiconductor substrate 100. Although junctions of the first impurity regions 124 are shown in FIG. 8B without an overlap, it should be understood that the inventive concepts herein are not limited to this configuration. For example, when the vertical transistor formed in this non-limiting embodiment is used for a desired purpose (e.g., a capacitor-less one transistor memory cell), the first impurity regions 124 may be overlapped and connected with each other, as in FIG. 6B.

Figure 8C:
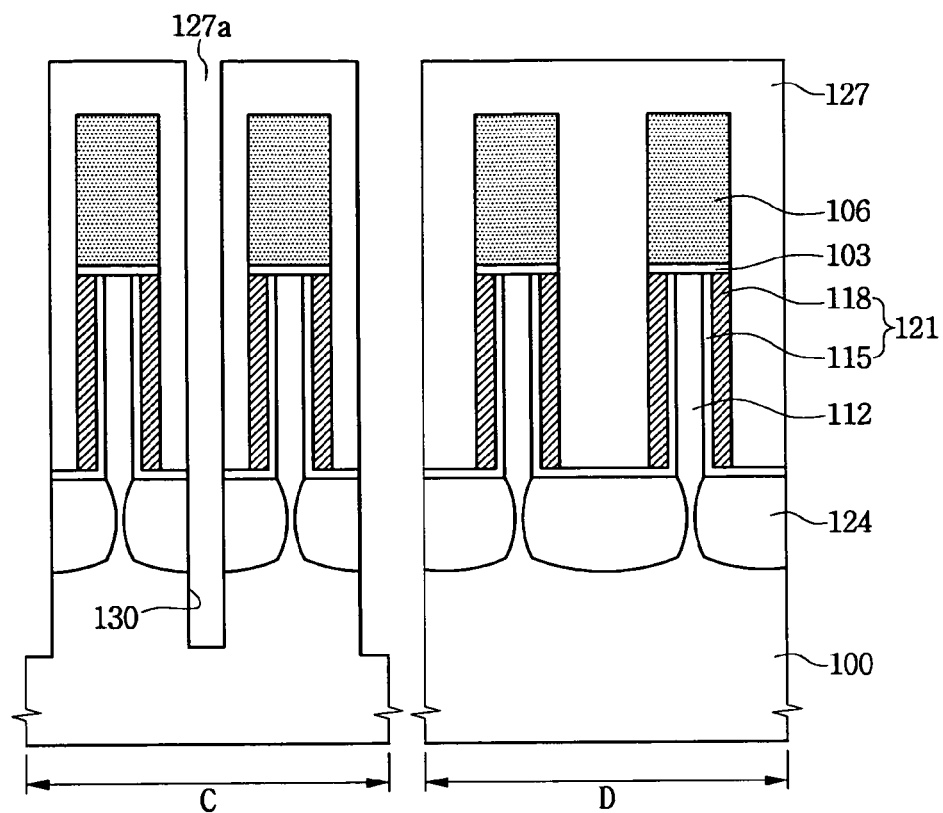

Referring to FIGS. 2, 7, and 8C, a dielectric material layer 127 may be formed on the entire surface of the semiconductor substrate 100 having the first impurity regions 124. The space between the semiconductor pillars 112 may be filled by the dielectric material layer 127. The dielectric material layer 127 may be formed of silicon oxide. The dielectric material layer 127 may be patterned to form openings 127a so as to expose a predetermined region of the semiconductor substrate 100 between the semiconductor pillars 112. When viewed from the top, the openings 127a may be formed in the shape of lines that are separated from each other. The semiconductor substrate 100 exposed by the openings 127a may be etched to form trench regions 130 (S220).

Figure 8D:
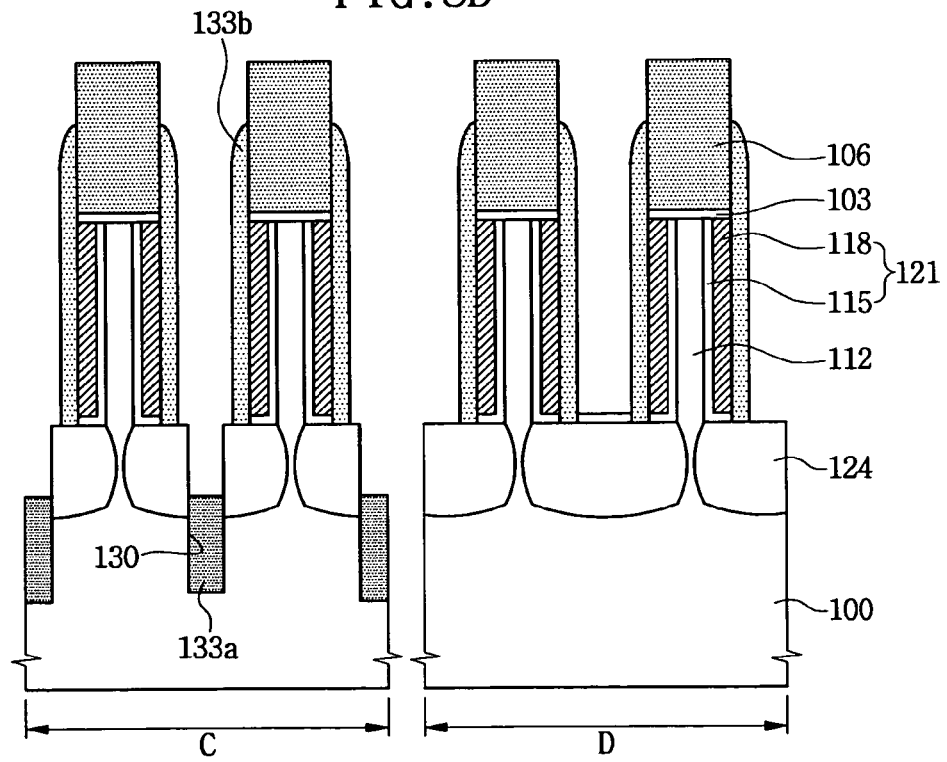

Referring to FIGS. 2, 7, and 8D, the dielectric material layer 127 (of FIG. 8C) may be removed. As in FIG. 6F, a spacer insulating layer may be formed on the semiconductor substrate 100 and etched to form dielectric spacers 133b on the sidewalls of the gate patterns 121 of the semiconductor pillars 112 as well as isolation patterns 133a partially filling the trench regions 130 (S230). Both the dielectric spacers 133b and the isolation patterns 133a may be formed of a dielectric material layer (e.g., silicon oxide layer).

Figure 8E:
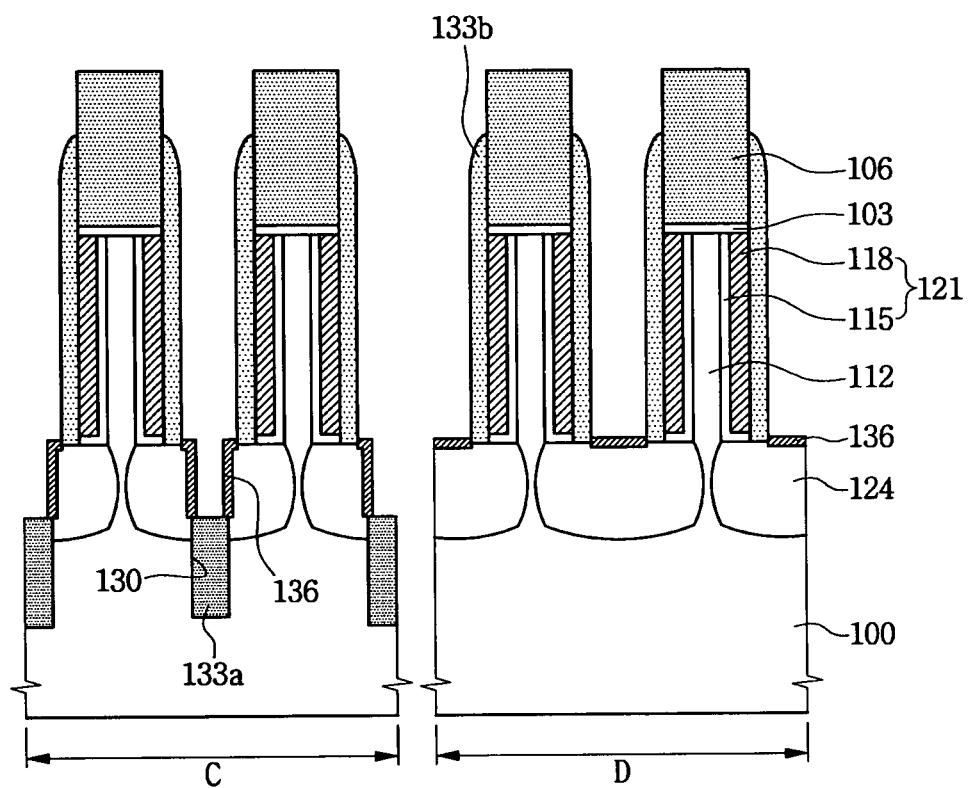

Referring to FIGS. 2, 7, and 8E (as in FIG. 6G), metal-semiconductor compound regions 136 may be formed on the sidewalls of portions of the trench regions 130 that are not filled by the dielectric isolation patterns 133a using a silicide process (S240). The metal-semiconductor compound regions 136 and the first impurity regions 124 may form ohmic contacts. Each metal-semiconductor compound region 136 may include a silicide material layer formed of cobalt silicide, titanium silicide, or nickel silicide. The metal-semiconductor compound regions 136 and the gate patterns 121 may be electrically insulated by the sidewall spacers 133b.

Figure 8F:
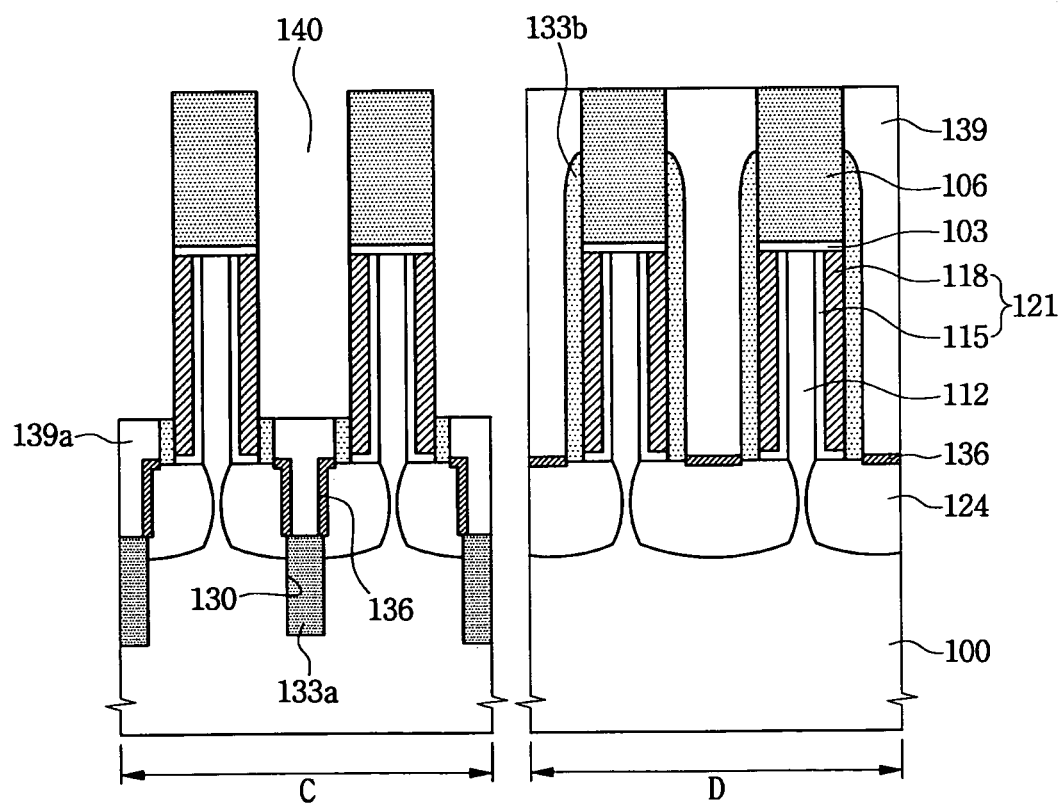

Referring to FIGS. 2, 7, and 8F, a first interlayer insulating layer 139 may be formed on the semiconductor substrate 100 having the metal-semiconductor compound regions 136. The first interlayer insulating layer 139 may be planarized to expose top surfaces of the mask patterns 106. Furthermore, the first interlayer insulating layer 139 may fill the remaining portions of the trench regions 130 and cover the metal-semiconductor compound regions 136 (S250). The first interlayer insulating layer 139 may be partially etched to form openings 140 using photolithography and etching processes. The openings 140 may each have the shape of a directional line intersecting the trench regions 130. The gate patterns 121 may be at least partially exposed by the openings 140. The first interlayer insulating layers 139a remaining on the bottom of the openings 140 may cover the metal-semiconductor compound regions 136.

Figure 8G:
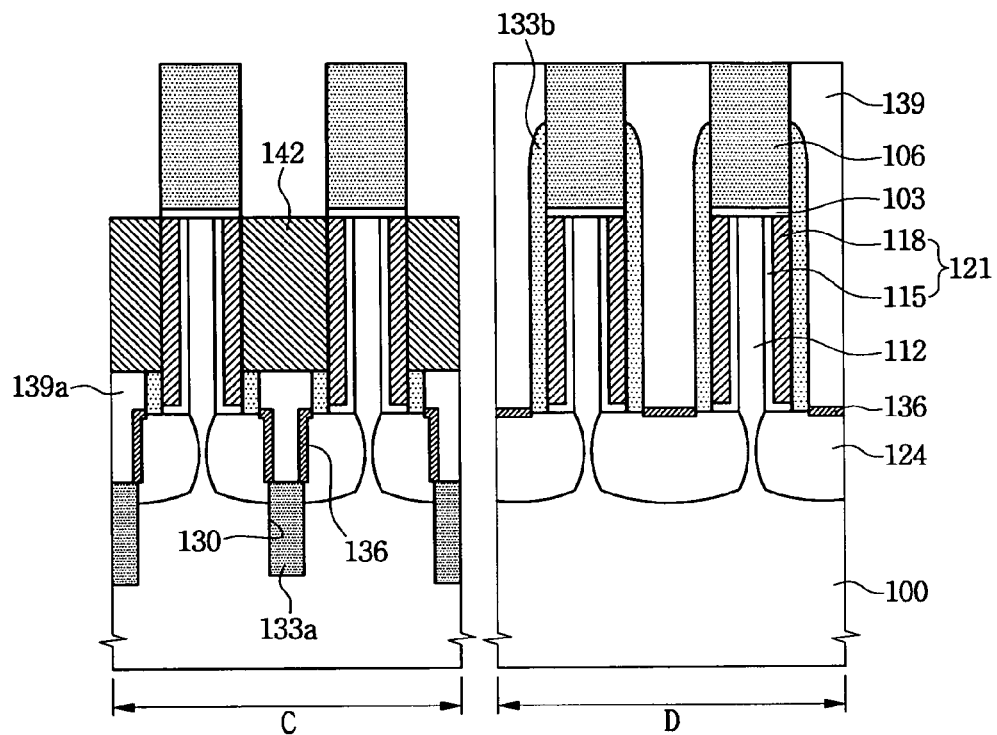

Referring to FIGS. 2, 7, and 8G, gate structures 142 may be formed in the openings 140 and electrically connected with the gate patterns 121 (S260). The gate structures 142 may be formed using a single damascene process. However, the gate structures 142 may also be formed using photolithography and etching processes (as described in connection with FIG.

6H). Similarly, the gate lines 39 of FIG. 6H may be also formed using the single damascene process as described in connection with FIGS. 8F and 8G.

Figure 8H:
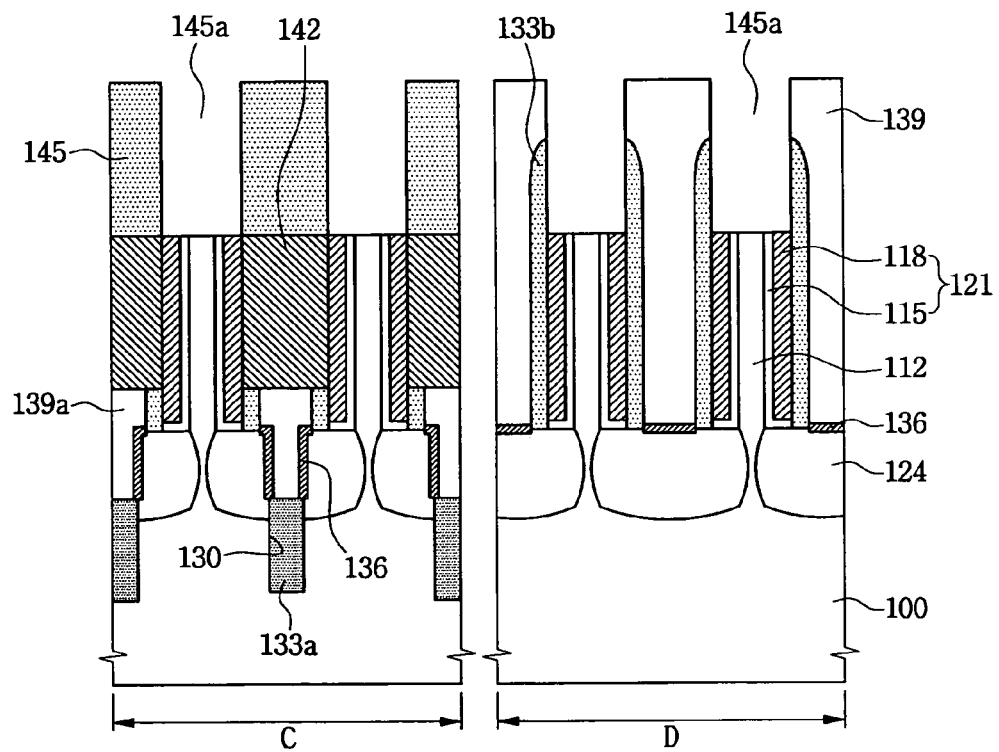

Referring to FIGS. 2, 7, and 8H, a second interlayer insulating layer 145 may be formed on the gate structures 142 so as to fill the remaining portions of the openings 140. The mask patterns 106 and the pad oxide layers 103 may be removed to form contact holes 145*a*.

Figure 8I:
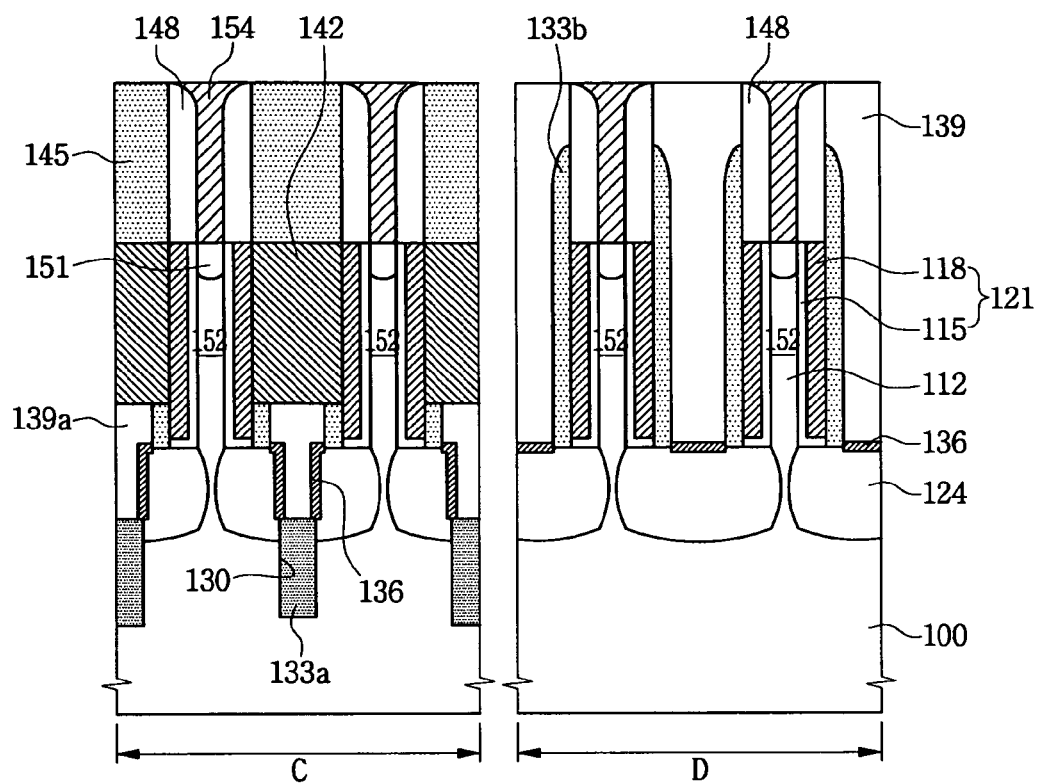

Referring to FIGS. 2, 7, and 8I, dielectric contact spacers 148 may be formed on sidewalls of the contact holes 145*a*. The contact spacers 148 may be formed of a silicon oxide layer and/or a silicon nitride layer. Impurities may be implanted into the semiconductor pillars 112, thereby forming second impurity regions 151. The second impurity regions 151 may have the same conductive type as the first impurity regions 124. Each second impurity region 151 may be defined as one of the source/drain regions of a transistor. Conductive contact structures 154 may be formed so as to fill the openings 140 and electrically connect with the second impurity regions 151. Thus, it is possible to form vertical MOS transistors including the first and second impurity regions 124 and 151 defined as the source/drain regions, the channel regions 152 of the semiconductor pillars 112 defined between the first and second impurity regions 124 and 151, and the gate patterns 121 surrounding the channel regions 152.

Figure 10A:
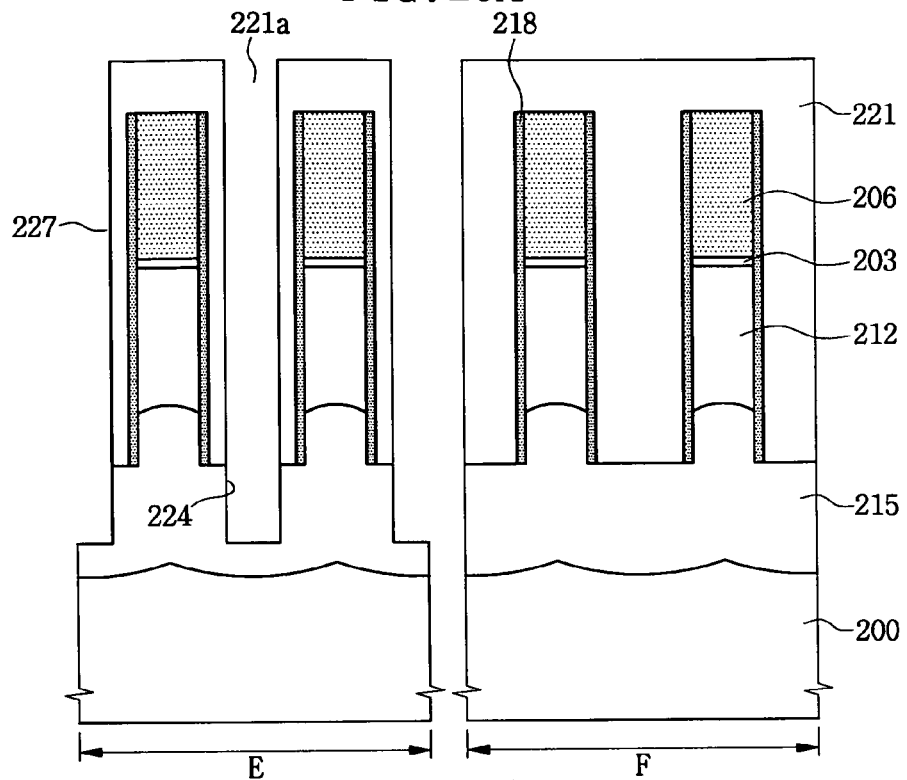

Next, a method of fabricating a semiconductor device according to yet another non-limiting example embodiment will be described with reference to FIGS. 9 and 10A through 10F. Referring to FIGS. 3, 9, and 10A, pad oxide layers 203 and mask patterns 206 may be sequentially stacked on a semiconductor substrate 200. The semiconductor substrate 200 may be etched using the mask patterns 206 as an etch mask, thereby forming semiconductor pillars 212 (S300). As in FIG. 6B, sidewall spacers 218 may be formed on sidewalls of the semiconductor pillars 212. Furthermore, impurities may be implanted and activated into the semiconductor substrate between the semiconductor pillars 212, thereby forming first impurity regions 215.

A dielectric material layer 221 may be formed on the entire surface of the semiconductor substrate 200 having the first impurity regions 215. The space between the semiconductor pillars 212 may be filled by the dielectric material layer 221. The dielectric material layer 221 may be formed of silicon oxide. The dielectric material layer 221 may be patterned to form openings 221*a* so as to expose a predetermined region of the semiconductor substrate 200 between the semiconductor pillars 212. The openings 221*a* may be formed in the shape of lines that are separated from each other. The semiconductor substrate 200 exposed by the openings 221*a* may be etched to form first trench regions 224 (S310).

Figure 10B:
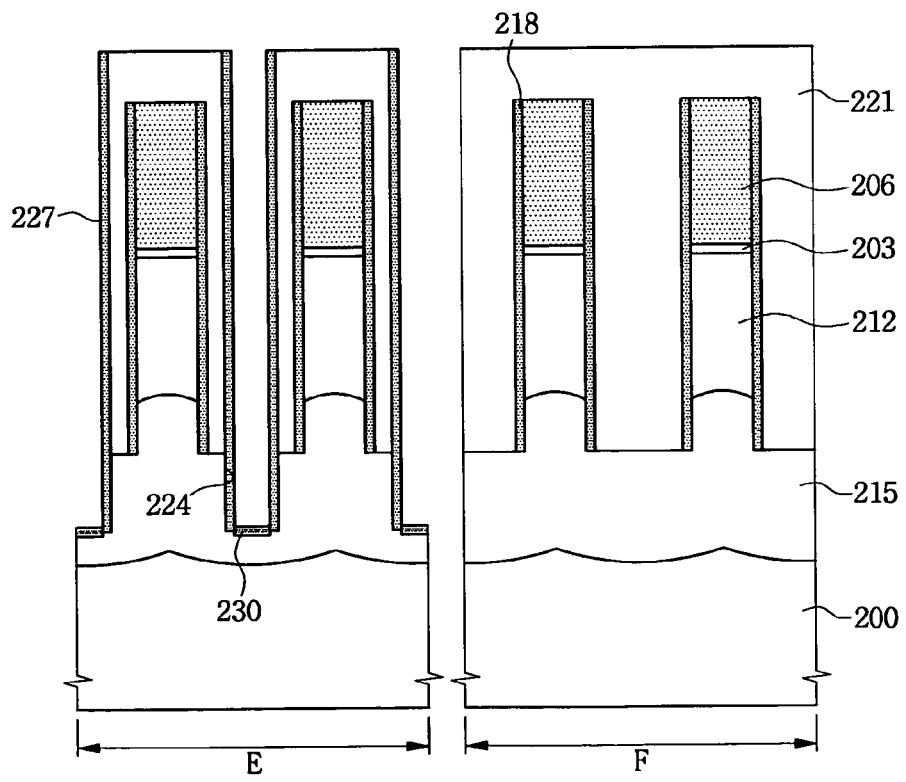

Referring to FIGS. 3, 9, and 10B, sacrificial spacers 227 may be formed on sidewalls of the first openings 221*a* and the first trench regions 224. The sacrificial spacers 227 may be formed of material having an etch selectivity with respect to the dielectric material layer 221. For example, when the dielectric material layer 221 is formed of silicon oxide, the sacrificial spacers 227 may be formed of silicon nitride. Sacrificial oxide layers 230 may be formed on bottom regions of the first trench regions 224. The sacrificial oxide layers 230 may be a thermal oxide layer.

Referring to FIGS. 3, 9, and 10C, the sacrificial spacers 227 may be removed to expose the sidewalls of the first trench regions 224. Metal-semiconductor compound regions 233 may be formed on the sidewalls of the first trench regions 224 using a silicide process (S320). The metal-semiconductor compound regions 233 may form ohmic contacts with the first impurity regions 215. The metal-semiconductor compound regions 233 may be metal silicide layers.

Referring to FIGS. 3, 9, and 10D, the sacrificial oxide layers 230 (of FIG. 10C) may be selectively removed. The semiconductor substrate 200 of the bottom regions of the first trench regions 224 may be etched to form second trench regions 236 (S330). The bottom regions of the second trench regions 236 may be located at a level lower than the first impurity regions 215.

Figure 10E:
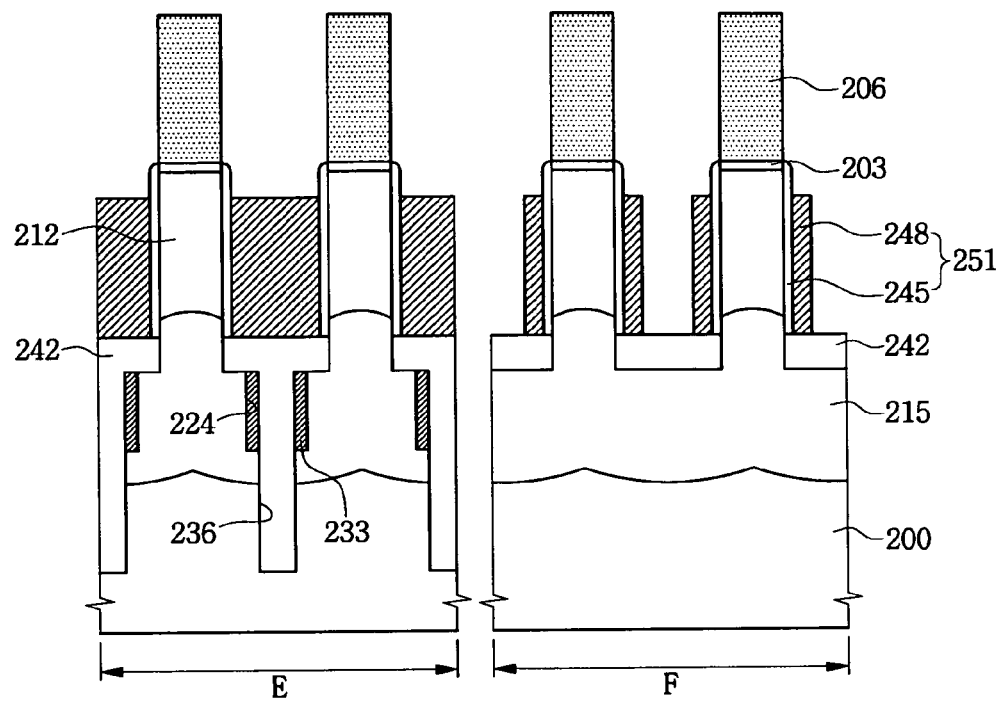

Referring to FIGS. 3, 9, and 10E, isolation patterns 242 may be formed to fill the first and second trench regions 224 and 236 and to cover the metal-semiconductor compound regions 233. Forming the isolation patterns 242 may include forming a dielectric material layer on the entire surface of the semiconductor substrate 200 having the first and second trench regions 224 and 236 and etching the dielectric material layer to expose portions of the semiconductor pillars 212 defined as channel regions. Gate dielectric layers 245 and gate lines 248 may be sequentially formed on the exposed sidewalls of the semiconductor pillars 212. The gate dielectric layers 245 and the gate lines 248 may be formed to surround the exposed sidewalls of the semiconductor pillars 212. The gate lines 248 may be defined as gate electrodes within regions surrounding the respective semiconductor pillars 212. The gate dielectric layers 245 and the gate lines 248 may be defined as gate patterns 251.

Figure 10F:
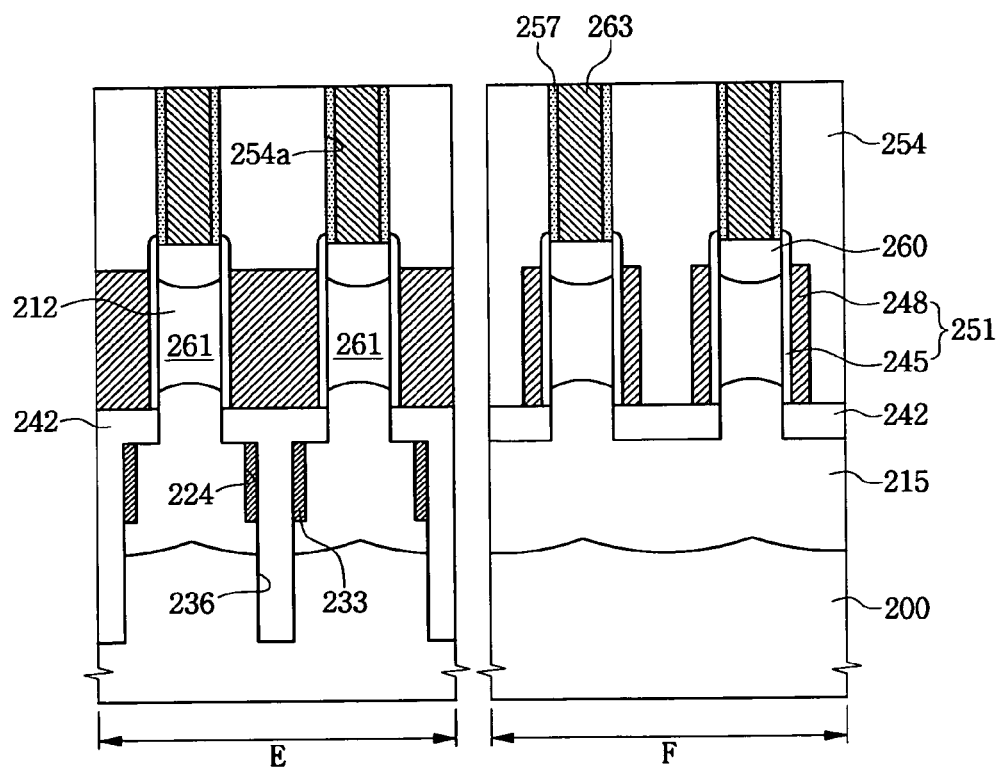

Referring to FIGS. 3, 9, and 10F, an interlayer insulating layer 254 may be formed on the semiconductor substrate 200 having the gate patterns 251. Forming the interlayer insulating layer 254 may include forming a dielectric material layer on the semiconductor substrate 200 having the gate patterns 251 and planarizing the dielectric material layer. The planarization may be performed until the top surfaces of mask patterns 206 (of FIG. 10E) are exposed. The mask patterns 206 (of FIG. 10E) and the pad oxide layers 203 (of FIG. 10E) may be removed to form contact holes 254*a*. Dielectric contact spacers 257 may be formed on sidewalls of the contact holes 254*a*. Impurities may be implanted into the semiconductor pillars 212 exposed by the contact holes 254*a*, thereby forming second impurity regions 260. The second impurity regions 260 may have the same conductive type as the first impurity regions 215. The first and second impurity regions 215 and 260 may be defined as source/drain regions of vertical transistors. Conductive contact structures 263 filling the contact holes 254*a* and electrically connected with the second impurity regions 260 may be formed. Thus, it is possible to form vertical MOS transistors including the first and second impurity regions 215 and 260, the channel regions 261 of the semiconductor pillars 212 defined between the first and second impurity regions 215 and 260, and the gate patterns 251 surrounding the channel regions 261.

According to example embodiments, a method of fabricating a semiconductor device may reduce or minimize an area occupied by conductors, e.g., metal-semiconductor compound regions electrically connected with one of the source/drain regions of a vertical transistor, and may facilitate the formation of the metal-semiconductor compound regions.

The foregoing is illustrative of example embodiments and should not be construed as limiting thereof. Although various example embodiments have been described, those ordinarily skilled in the art will readily appreciate that many modifications and alternatives are possible in connection with such example embodiments without materially departing from the novel teachings and advantages of the inventive concepts herein. Accordingly, all such modifications and alternatives are intended to be included within the scope of the inventive concepts as defined in the claims. In the claims, means-plus-function clauses (if applicable) are intended to cover the structures described herein as performing the recited function, and not only structural equivalents but also equivalent structures. Therefore, it should be understood that the foregoing is merely illustrative of various example embodiments and should not be construed as limited to the specific examples disclosed, and that modifications to the disclosed embodiments, as well as other embodiments, are intended to be included within the scope of the appended claims.

What is claimed is:

1. A method of fabricating a semiconductor device, comprising:
    forming semiconductor pillars on a semiconductor substrate;
    etching the semiconductor substrate between the semiconductor pillars to form a trench region;
    forming an isolation pattern so as to partially fill the trench region and forming sidewall spacers on sidewalls of the semiconductor pillars; and
    after forming the isolation pattern and the sidewall spacers, forming metal-semiconductor compound regions on sidewalls of a portion of the trench region not filled by the isolation pattern.

2. The method according to claim 1, wherein the semiconductor pillars are two-dimensionally arranged in row and column directions based on a top view, and the trench region extends in parallel to the row or column direction.

3. The method according to claim 1, further comprising:
    forming an insulating pattern on the isolation pattern, wherein the insulating pattern fills a remaining portion of the trench region not occupied by the isolation pattern and covers the metal-semiconductor compound regions.

4. The method according to claim 3, further comprising:
    etching the sidewall spacers to expose the sidewalls of the semiconductor pillars; and
    forming gate patterns surrounding the exposed sidewalls of the semiconductor pillars,
    wherein the gate patterns include directional linear gate lines intersecting the trench region.

5. The method according to claim 3, further comprising:
    forming gate patterns surrounding the sidewalls of the semiconductor pillars prior to forming the trench region; and
    forming gate structures electrically connecting the gate patterns after forming the insulating pattern.

6. The method according to claim 1, further comprising:
    implanting and activating impurities in the semiconductor substrate between the semiconductor pillars to form impurity regions having a conductive type different from that of the semiconductor pillars prior to forming the trench region,
    wherein the trench region has a bottom region located at a level lower than the impurity regions, and the impurity regions are adjacent to the sidewalls of the trench region so as to form ohmic contacts with the metal-semiconductor compound regions.

7. The method according to claim 1, wherein forming the isolation pattern and sidewall spacers includes:
    forming a spacer insulating layer filling the trench region while covering the sidewalls of the semiconductor pillars; and
    etching the spacer insulating layer such that the isolation pattern and the sidewall spacers are formed.

8. The method according to claim 1, wherein the metal-semiconductor compound regions are formed of a metal silicide.

9. A method of fabricating a semiconductor device, comprising:
    forming semiconductor pillars on a semiconductor substrate;
    etching the semiconductor substrate between the semiconductor pillars to form a first trench region;
    forming metal-semiconductor compound regions on sidewalls of the first trench region; and
    after forming the metal-semiconductor compound regions, etching the semiconductor substrate of a bottom region of the first trench region to form a second trench region.

10. The method according to claim 9, further comprising:
    forming an isolation pattern filling the first and second trench regions while covering the metal-semiconductor compound regions.

11. The method according to claim 10, further comprising:
    forming gate patterns surrounding sidewalls of the semiconductor pillars after forming the isolation pattern.

12. The method according to claim 10, further comprising:
    forming gate patterns surrounding sidewalls of the semiconductor pillars prior to forming the first trench regions; and
    forming gate structures electrically connecting the gate patterns after forming the isolation pattern.

13. The method according to claim 9, wherein the semiconductor pillars are two-dimensionally arranged in row and column directions based on a top view, and the first and second trench regions extend in parallel to the row or column direction.

14. The method according to claim 9, further comprising:
    implanting and activating impurities in the semiconductor substrate between the semiconductor pillars to form impurity regions having a conductive type different from that of the semiconductor pillars prior to forming the first trench region,
    wherein the impurity regions are located at a level higher than a bottom region of the second trench region and form ohmic contacts with the metal-semiconductor compound regions.

15. The method according to claim 9, wherein forming the first trench region includes:
    forming a dielectric material layer on the semiconductor substrate having the semiconductor pillars;
    patterning the dielectric material layer to form an opening between the semiconductor pillars, wherein the opening is spaced apart from the semiconductor pillars and exposes a predetermined region of the semiconductor substrate between the semiconductor pillars; and
    etching the semiconductor substrate exposed by the opening.

16. The method according to claim 15, wherein forming the metal-semiconductor compound regions includes:
- forming a sacrificial spacer on sidewalls of the first trench region and the opening;
- performing thermal oxidation on the semiconductor substrate having the sacrificial spacer to form a thermal oxide layer on the bottom region of the first trench region;
- removing the sacrificial spacer to expose the sidewalls of the first trench region; and
- performing a silicide process to form the metal-semiconductor compound regions on the exposed sidewalls of the first trench region.

17. The method according to claim 16, wherein forming the second trench region includes etching the thermal oxide layer as well as the semiconductor substrate under the thermal oxide layer, and the dielectric material layer is removed after forming the second trench region.

18. The method according to claim 10, wherein the metal-semiconductor compound regions are formed of a metal silicide.

19. The method according to claim 18, wherein the metal silicide is a cobalt silicide, a titanium silicide, or a nickel silicide.

20. The method according to claim 1, wherein the metal-semiconductor compound regions are formed on uppermost sidewalls of the trench region.

* * * * *